(12) United States Patent
Zhu

(10) Patent No.: US 8,361,875 B2
(45) Date of Patent: Jan. 29, 2013

(54) DEEP TRENCH CAPACITOR ON BACKSIDE OF A SEMICONDUCTOR SUBSTRATE

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 12/701,672

(22) Filed: Feb. 8, 2010

(65) Prior Publication Data

US 2010/0230735 A1 Sep. 16, 2010

Related U.S. Application Data

(60) Provisional application No. 61/159,538, filed on Mar. 12, 2009.

(51) Int. Cl.
*H01L 21/20* (2006.01)

(52) U.S. Cl. ............... 438/386; 257/301; 257/E21.008

(58) Field of Classification Search .............. 257/301, 257/E21.008; 438/386
See application file for complete search history.

(56) References Cited

U.S. PATENT DOCUMENTS

| | | | | |
|---|---|---|---|---|
| 5,945,704 A * | 8/1999 | Schrems et al. | ............. | 257/301 |
| 6,281,068 B1 * | 8/2001 | Coronel et al. | ............. | 438/243 |
| 6,362,040 B1 * | 3/2002 | Tews et al. | ............. | 438/246 |
| 7,214,982 B2 * | 5/2007 | Kumura et al. | ............. | 257/301 |
| 7,262,452 B2 * | 8/2007 | Chae | ............. | 257/301 |
| 7,439,149 B1 * | 10/2008 | Cheng et al. | ............. | 438/386 |
| 7,557,013 B2 * | 7/2009 | Bhat et al. | ............. | 438/396 |
| 7,638,391 B2 * | 12/2009 | Cheng et al. | ............. | 438/243 |
| 7,659,202 B2 * | 2/2010 | Trezza | ............. | 438/675 |
| 2001/0020712 A1 * | 9/2001 | Raaijmakers et al. | ........ | 257/301 |
| 2001/0042880 A1 * | 11/2001 | Divakaruni et al. | ......... | 257/301 |
| 2001/0050388 A1 * | 12/2001 | Hamamoto | .................. | 257/301 |
| 2003/0015749 A1 * | 1/2003 | Zielbauer | ..................... | 257/301 |
| 2003/0116798 A1 * | 6/2003 | Park | .............. | 257/301 |
| 2004/0209436 A1 * | 10/2004 | Chen | .............. | 438/386 |
| 2005/0104109 A1 * | 5/2005 | Wu et al. | .............. | 257/301 |
| 2005/0118760 A1 * | 6/2005 | Fishburn et al. | ............. | 438/239 |
| 2005/0145914 A1 * | 7/2005 | Tanaka et al. | ............. | 257/301 |
| 2005/0247966 A1 * | 11/2005 | Adkisson et al. | ............. | 257/301 |
| 2005/0250290 A1 * | 11/2005 | Temmler | ..................... | 438/387 |
| 2006/0076603 A1 * | 4/2006 | Matsuda | ..................... | 257/301 |
| 2006/0076624 A1 * | 4/2006 | Nagano et al. | ............. | 257/350 |
| 2006/0145228 A1 * | 7/2006 | Kito et al. | .............. | 257/301 |
| 2006/0244029 A1 * | 11/2006 | Moens et al. | ............. | 257/301 |
| 2007/0012983 A1 * | 1/2007 | Yang et al. | ............. | 257/301 |
| 2007/0015327 A1 * | 1/2007 | Su | .............. | 438/244 |
| 2008/0265299 A1 * | 10/2008 | Bulsara et al. | ............. | 257/301 |
| 2010/0164062 A1 * | 7/2010 | Wang et al. | ............. | 257/532 |
| 2010/0178747 A1 * | 7/2010 | Ellul et al. | .............. | 438/386 |
| 2010/0270674 A1 * | 10/2010 | Zhu | .............. | 257/758 |
| 2010/0283093 A1 * | 11/2010 | Pei et al. | ............. | 257/303 |
| 2011/0027962 A1 * | 2/2011 | Bernstein et al. | ............. | 438/386 |

(Continued)

*Primary Examiner* — N Drew Richards
*Assistant Examiner* — Grant Withers
(74) *Attorney, Agent, or Firm* — Scully, Scott, Murphy & Presser, P.C.; H. Daniel Schnurmann

(57) ABSTRACT

A pair of through substrate vias is formed through a stack including a lightly doped semiconductor and a bottom semiconductor layer in a semiconductor substrate. The top semiconductor layer includes semiconductor devices such as field effect transistors. At least one deep trench is formed on the backside of the semiconductor substrate in the bottom semiconductor layer and at least one dielectric layer thereupon. A node dielectric and a conductive inner electrode are formed in each of the at least one deep trench. Substrate contact vias abutting the bottom semiconductor layer are also formed in the at least one dielectric layer. Conductive wiring structures on the backside of the semiconductor substrate provide lateral connection between the through substrate vias and the at least one conductive inner electrode and the substrate contact vias.

20 Claims, 19 Drawing Sheets

U.S. PATENT DOCUMENTS

2011/0169131 A1*  7/2011  Nakos et al. ............... 257/532
2011/0227158 A1*  9/2011  Zhu ........................... 257/347
2012/0025288 A1*  2/2012  Doris et al. ................ 257/301
2012/0056323 A1*  3/2012  Zhu ........................... 257/751
2012/0139080 A1*  6/2012  Wang et al. ............... 257/506
2012/0193797 A1*  8/2012  Zhu ........................... 257/769

* cited by examiner

US 8,361,875 B2

DEEP TRENCH CAPACITOR ON BACKSIDE OF A SEMICONDUCTOR SUBSTRATE

This non-provisional application claims the benefit of the provisional application filed with the U.S. Patent and Trademark Office as Ser. No. 61/159,538 entitled, "Deep Trench Capacitor on Backside of a Semiconductor Substrate", filed Mar. 12, 2009.

FIELD OF THE INVENTION

The present invention relates to a semiconductor structure, and particularly to a deep trench capacitor on the backside of a semiconductor substrate, and methods of manufacturing the same.

BACKGROUND OF THE INVENTION

Deep trench capacitors are used in a variety of semiconductor chips for high areal capacitance and low device leakage. Typically, a deep trench capacitor provides a capacitance in the range from about 4 fF to about 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Deep trench capacitors are also used in an array to stabilize the power supply voltage on a semiconductor chip by decoupling alternating current (AC) components and spurious noise in the power supply circuits of the semiconductor chip. Such deep trench capacitor are called decoupling capacitors since the capacitors decouple the AC components and noise in the power supply circuit from the direct current (DC) component of the supply voltage and provide only the DC component to the circuit, thereby stabilizing the system supply voltage.

While deep trench capacitors provide a large areal capacitance, i.e., capacitance per unit area, some applications of deep trench capacitors such as decoupling capacitors require a large device area due to the need for a large capacitance. For example, to filter out AC noise above 1 MHz range, the Rc time constant of a low pass filter in the power supply needs to be on the order of 1 µs. In case the resistance of the circuit is on the order of 1 kΩ, the capacitance of the decoupling capacitor needs to be on the order of 1 nF. Considering that a typical deep trench capacitor has a capacitance of 40 fF, about 25,000 deep trench capacitors are required to provide such a capacitance, with accompanying areal requirement on the surface of a semiconductor chip.

SUMMARY OF THE INVENTION

The present invention provides a semiconductor structure including a deep trench capacitor formed on the backside of a semiconductor substrate and connected to the front side with a through-substrate via, and methods of manufacturing the same.

In the present invention, a pair of through substrate vias is formed through a stack including a lightly doped semiconductor and a bottom semiconductor layer in a semiconductor substrate. The top semiconductor layer includes semiconductor devices such as field effect transistors. At least one deep trench is formed on the backside of the semiconductor substrate in the bottom semiconductor layer and at least one dielectric layer thereupon. A node dielectric and a conductive inner electrode are formed in each of the at least one deep trench. Substrate contact vias abutting the bottom semiconductor layer are also formed in the at least one dielectric layer. Conductive wiring structures on the backside of the semiconductor substrate provide lateral connection between the through substrate vias and the at least one conductive inner electrode and the substrate contact vias.

The conductive inner electrode(s), the node dielectric(s), and the bottom semiconductor layer constitute a capacitor that may be electrically connected to semiconductor devices on the front side through the pair of through substrate vias. Since the capacitor of the present invention is formed on the backside of the substrate, the areal requirement of the capacitor of the present invention is the area of the pair of through substrate vias on the front side of the semiconductor substrate. The depth of the trenches on the backside is only limited by the thickness of the heavily doped semiconductor substrate, and may be up to about 800 microns, thereby providing a large capacitance for the capacitor. The substrate may be a bulk substrate in which the top semiconductor layer vertically abuts the bottom semiconductor layer, or may be a semiconductor-on-insulator (SOI) substrate in which a buried insulator layer separates the top semiconductor layer from the bottom semiconductor layer.

According to an aspect of the present invention, a semiconductor structure is provided, which includes at least one semiconductor device located directly on a front side surface of a semiconductor substrate; a trench capacitor located directly on a backside surface of the semiconductor substrate and comprising a conductive inner electrode, a node dielectric, and a bottom semiconductor layer having a dopant concentration of $1.0 \times 10^{18}/cm^3$ or greater; and a pair of through-substrate vias electrically connecting the conductive inner electrode and the bottom semiconductor layer to the at least one semiconductor device.

According to another aspect of the present invention, a method of forming a semiconductor structure is provided, which includes forming at least one semiconductor device directly on a front side surface of a semiconductor substrate; forming a pair of through-substrate vias extending at least from the front side surface of the semiconductor substrate to a backside surface of the semiconductor substrate; and forming a trench capacitor directly on the backside surface of the semiconductor substrate, wherein the trench capacitor includes a conductive inner electrode, a node dielectric, and a bottom semiconductor layer having a dopant concentration of $1.0 \times 10^{18}/cm^3$ or greater, wherein the pair of through-substrate vias provide electrical connection between the at least one semiconductor device and conductive inner electrode and the bottom semiconductor layer.

BRIEF DESCRIPTION OF THE DRAWINGS

FIGS. 1A, 1B, 2A, 2B, 3A, 3B, 4A, 4B, 5A, 5B, 6A-10D are sequential views of a first exemplary semiconductor according to a first embodiment of the present invention at various stages of a manufacturing process. Figures with the same numeric label correspond to the same stage of manufacturing. Figures with the suffix "A" are top-down views. Figures with the suffix "B," "C," or "D" are vertical cross-sectional views along the plane B-B', C-C', or D-D', respectively, of the corresponding figure with the same numeric label and the suffix "A."

FIGS. 1A and 1B correspond to the step after formation of a front side dielectric layer.

FIGS. 2A and 2B correspond to the step after formation of a pair of through-substrate vias.

FIGS. 3A and 3B correspond to the step after removal of a sacrificial layer from the backside of the semiconductor substrate.

FIGS. 4A and 4B correspond to the step after deposition and planarization of a first backside dielectric layer.

FIGS. 5A and 5B correspond to the step after deposition of a second backside dielectric layer and a third backside dielectric layer and application of a photoresist.

FIGS. 6A-6D correspond to the step after formation of at least one deep trench.

FIGS. 10A-10D correspond to the step after formation of conductive wiring structures.

FIG. 11A is a top-down view. FIGS. 11B, 11C, and 11D are vertical cross-sectional views along the plane B-B', C-C', or D-D', respectively.

FIG. 12A is a top-down view. FIGS. 12B, 12C, and 12D are vertical cross-sectional views along the plane B-B', C-C', or D-D', respectively.

DETAILED DESCRIPTION OF THE INVENTION

As stated above, the present invention relates to a deep trench capacitor on the backside of a semiconductor substrate, and methods of manufacturing the same, which are now described in detail with accompanying figures. The drawings are not necessarily drawn to scale.

Figure 1A:
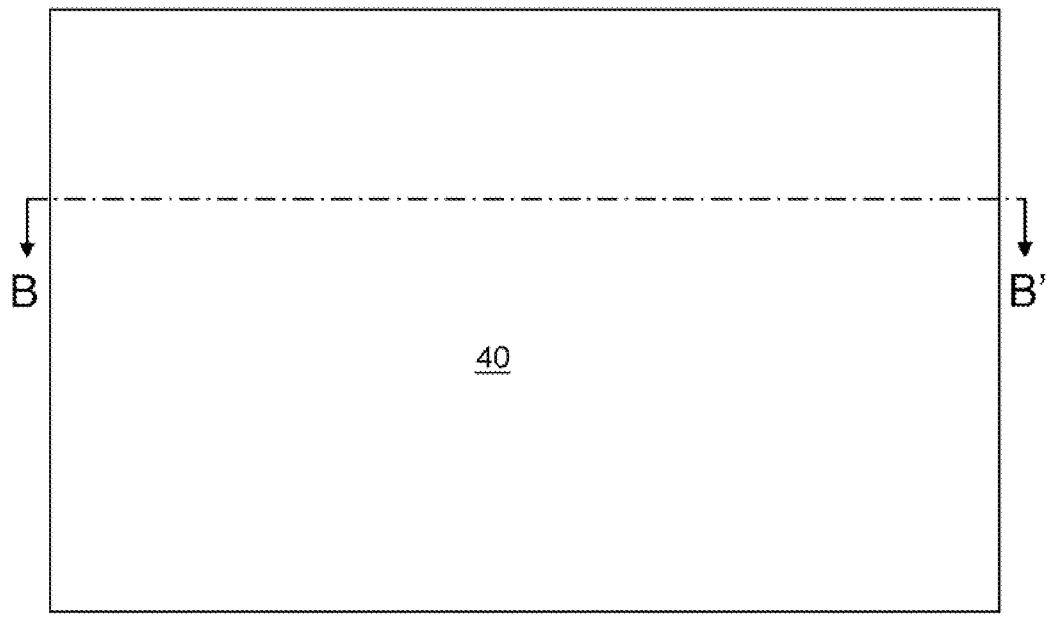
Figure 1B:
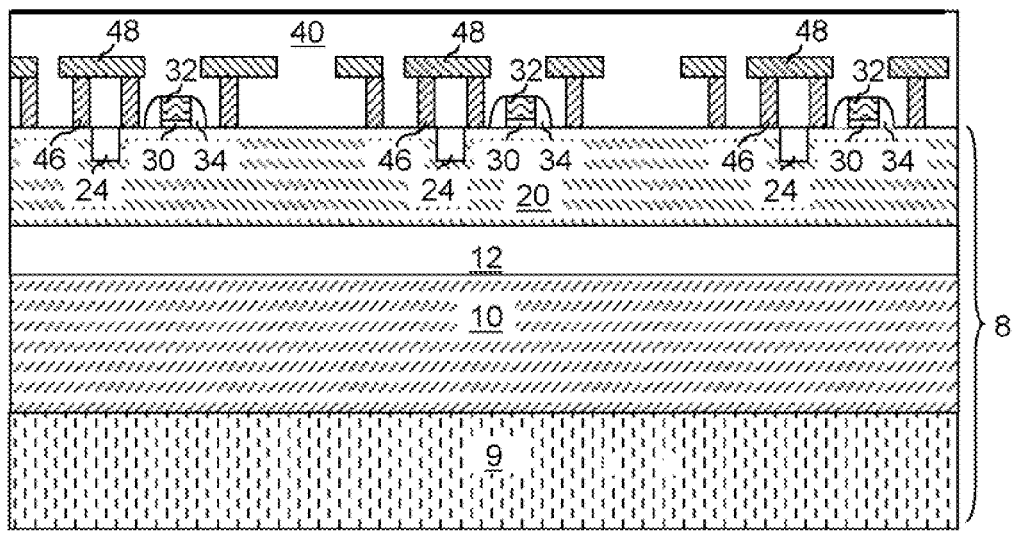

Referring to FIGS. 1A and 1B, a first exemplary semiconductor structure according to a first embodiment of the present invention includes a semiconductor substrate 8, at least one semiconductor device formed directly on a front side surface of the semiconductor substrate, a front side dielectric layer 40, and metal interconnect structures embedded in the front side dielectric layer 40. The semiconductor substrate 8 includes, from top to bottom, a top semiconductor layer 20, a buried insulator layer 12, a bottom semiconductor layer 10, and a sacrificial layer 9.

Each of the top semiconductor layer 20 and the bottom semiconductor layer 10 includes a semiconductor material. The semiconductor material for the top semiconductor layer 20 and the bottom semiconductor layer 10 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material for the top semiconductor layer 20 and the bottom semiconductor layer 10 includes silicon.

Preferably, the top semiconductor layer 20 includes a single crystalline material having an epitaxial alignment throughout an entirety of the top semiconductor layer 20. A single crystalline material for the top semiconductor layer 20 enables formation of many types of semiconductor devices in and directly on the top semiconductor layer 20 such as field effect transistors, bipolar transistors, and/or any other semiconductor devices that employ a single crystalline semiconductor material. However, embodiments in which the top semiconductor layer 20 includes at least one polycrystalline or amorphous semiconductor material are also contemplated herein. The bottom semiconductor layer 10 may include a single crystalline material having an epitaxial alignment throughout an entirety of the bottom semiconductor layer 10, or may include a polycrystalline material such as polysilicon, i.e., polycrystalline silicon. In one example, the entirety of the top semiconductor layer 20 is single crystalline, and the entirety of the bottom semiconductor layer 10 is single crystalline.

Preferably, the top semiconductor layer 20 is lightly doped, and the bottom semiconductor layer 10 is heavily doped. As described herein, a lightly doped semiconductor layer is a semiconductor layer doped with electrical dopants at a doping concentration less than $1.0 \times 10^{18}/cm^3$, and a heavily doped semiconductor layer is a semiconductor layer doped with electrical dopants at a doping concentration of $1.0 \times 10^{18}/cm^3$ or greater. Electrical dopants refer to the elements that provide a charge carrier to the semiconductor layer. The electrical dopants may be p-type dopants such as B, Ga, and In, which provide holes as charge carriers to the semiconductor layer, or may be n-type dopants such as P, As, and Sb, which provide electrons as charge carriers to the semiconductor layer. The top semiconductor layer 20 and the bottom semiconductor layer 10 may have the same type of doping, or different types of doping.

The buried insulator layer 12 includes a dielectric material such as a dielectric oxide, a dielectric nitride, or a dielectric oxynitride. Exemplary materials for the buried insulator layer 12 include, but are not limited to, silicon oxide, silicon nitride, silicon oxynitride, silicate glass, sapphire, aluminum oxide, ceramics, etc. The buried insulator layer 12 vertically abuts the bottom surface of the top semiconductor layer 20 and the top surface of the bottom semiconductor layer 10.

The sacrificial layer 9 is a layer that is subsequently removed, for example, by chemical mechanical planarization, recess etch, etc. The sacrificial layer 9 may include the same material as, or a different material from, the bottom semiconductor layer 10. In case the sacrificial layer 9 includes a different material from the bottom semiconductor layer 10, the sacrificial layer 9 may include a different semiconductor material having a different composition than the bottom semiconductor layer 10, a conductive material such as an elemental metal, a metal alloy, or a conductive metallic compound, or a dielectric material such as a dielectric oxide, a dielectric nitride, a dielectric oxynitride, or a ceramic material.

The thickness of the semiconductor substrate 8 is typically from about 500 μm to about 1,000 μm. The thickness of the top semiconductor layer 20 may be from about 10 nm to about 300 nm, and typically from about 30 nm to about 150 nm, although lesser and greater thicknesses are also contemplated herein. The thickness of the buried insulator layer 20 may be from about 50 nm to about 2,000 nm, and typically from about 100 nm to about 500 nm, although lesser and greater thicknesses are also contemplated. The thickness of the bottom semiconductor layer 10 may be from about 400 μm to about 1,000 μm, and accounts for most of the total thickness of the semiconductor substrate 8. The thickness of the sacrificial layer 9 may be from about 1 μm to about 200 μm, and typically from about 10 μm to about 100 μm, although lesser and greater thicknesses are also contemplated herein.

The at least one semiconductor device is formed in the top semiconductor layer 20 and/or directly on the top surface of the top semiconductor layer 20. The top surface of the top semiconductor layer 20 is the interface between the top semiconductor layer 20 and the front side dielectric layer 40, and is the same as the front side surface of the semiconductor substrate 8. The at least one semiconductor device may include field effect transistors such as metal-oxide-semiconductor field effect transistors (MOSFETs) and junction field effect transistors (JFETs), bipolar transistors, diodes, resistors, capacitors, inductors, varactors, and/or any other type of semiconductor devices. For example, the at least one semiconductor device may include field effect transistors, each of which include a gate dielectric 30, a gate electrode 32, and a gate spacer 34 located directly on and above the top surface of the top semiconductor layer 20 and a source region (not shown) and a drain region (not shown) that are formed directly on and underneath the top surface of the top semiconductor layer 20 and underlap the gate spacer 34 and peripheral portions of the gate dielectric 30.

The front side dielectric layer 40 is formed over the at least one semiconductor device and exposed portions of the top surface of the top semiconductor layer 20 by deposition of a dielectric material. Dielectric materials that may be used for the front side dielectric layer 40 include, but are not limited to, a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may non-porous or porous. The front side dielectric layer 40 may include multiple layers of different dielectric materials.

Metal interconnect structures are embedded in the front side dielectric layer 40 by methods known in the art such as single damascene back-end-of-line (BEOL) integration scheme, dual damascene BEOL integration scheme, etc. The metal interconnect structures may include front side substrate contact vias 48 and interconnect-level metal lines 48. Additional conductive vias (not shown) and additional interconnect-level metal lines may be formed above the interconnect-level metal lines 48 in a multi-level BEOL interconnect structure, which is embedded in the front side dielectric layer 40. In this case, the front side dielectric layer 40 includes multiple levels of dielectric layers each embedding at least one metal interconnect structure. The metal interconnect structures include a conductive material such as Cu, Al, Au, Ag, W, Ta, Ti, WN, TaN, TiN, etc. Typically, the metal interconnect structure include metallic materials. The thickness of the front side dielectric layer 40 may be the same as the total thickness of the entirety of BEOL interconnect structures, and may be from about 1 μm to about 20 μm, and typically from about 2 μm to about 10 μm, although lesser and greater thicknesses are also contemplated herein.

Figure 2A:
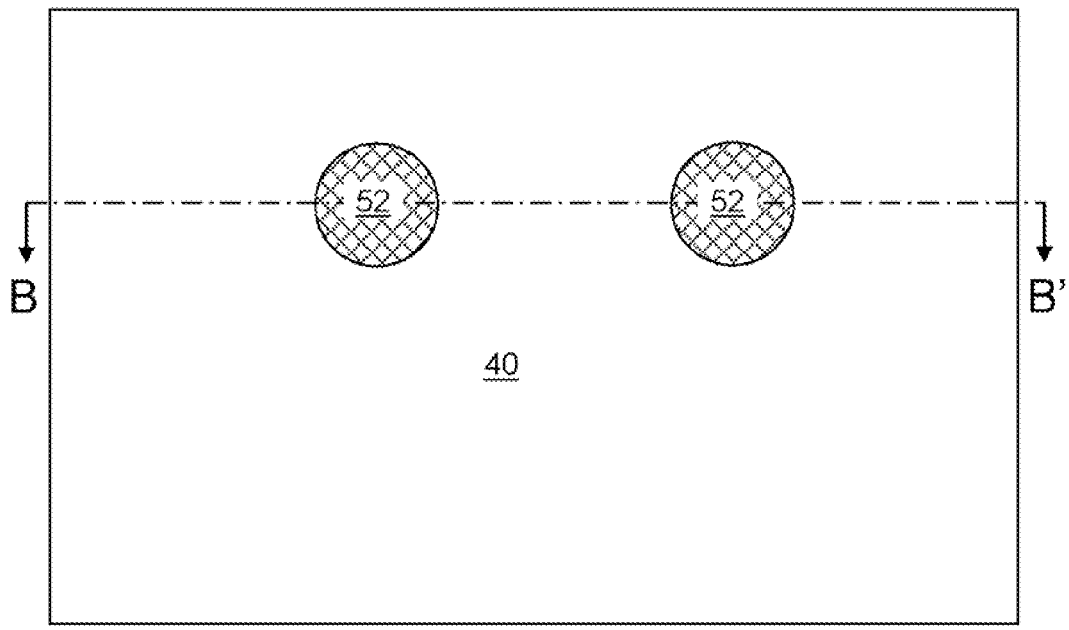
Figure 2B:
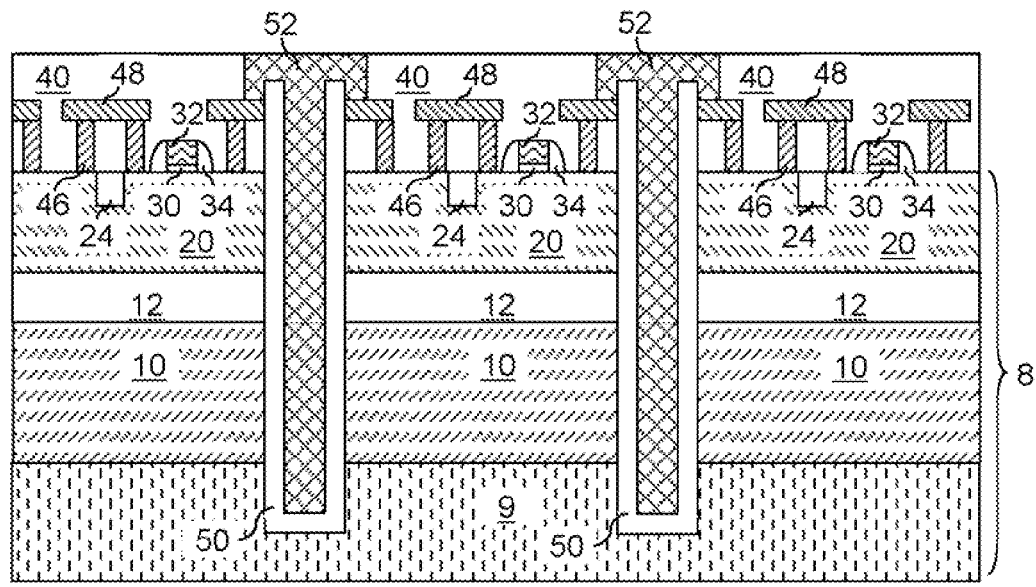

Referring to FIGS. 2A and 2B, a pair of trenches is formed from the top surface of the front side dielectric layer 40 through the front side dielectric layer, the top semiconductor layer 20, the buried insulator layer 12, the bottom semiconductor layer, and partially into the sacrificial layer 9. The pair of trenches may be formed, for example, by applying a photoresist on the top surface of the front side dielectric layer 40, lithographically patterning a pair of openings in the photoresist, and transferring the image of the pair of openings through the front side dielectric layer 40 and into the semiconductor substrate 8 and at least past the interface between the bottom semiconductor layer 10 and the sacrificial layer 9. Preferably, the pair of trenches does not reach the bottom surface of the sacrificial layer 9, which is the bottom surface of the semiconductor substrate. The lateral dimensions of each of the pair of trenches, e.g., a diameter, may be from about 0.5 μm to about 50 μm, and typically from about 1 μm to about 10 μm, although lesser and greater dimensions are also contemplated herein.

A pair of dielectric liners 50 is formed on the bottom surface and sidewalls of the pair of trenches by a conformal deposition of a dielectric layer (not shown). The pair of dielectric liners 50 provides electrical isolation of a pair of through-substrate vias to be subsequently formed in the pair of trenches from the structures outside of the pair of dielectric liners 50. The thickness of the dielectric liners 50 may be from about 50 nm to about 2,000 nm, and typically from about 100 nm to about 500 nm, although lesser and greater thicknesses are also contemplated herein. Portions of the pair of dielectric liners 50 may be added to the front side dielectric layer 40.

Portions of the front side dielectric layer 40 and the pair of dielectric liners 50 are removed from around the openings of the pair of trenches, for example, by lithographic means and an accompanying etch. A pair of through-substrate vias 52 is formed within the pair of trenches and over the exposed portions of the metal interconnect structures (46, 48). The pair of through-substrate vias 52 includes a conductive material such as Cu, Al, W, Ta, Ti, Ni, WN, TaN, TiN, a doped semiconductor material such as doped polysilicon, or a combination thereof. The conductive material may be deposited by electroplating, physical vapor deposition (PVD), electroless plating, chemical vapor deposition, or a combination thereof. For example, if the conductive material is copper, the pair of through-substrate vias 52 may be formed by a combination of physical vapor deposition, i.e., sputtering, of Cu, followed by electroplating of Cu. The conductive material fills the pair of trenches. The excess conductive material that is deposited above the top surface of the front side dielectric layer 40 may be removed, for example, by chemical mechanical planarization (CMP), a recess etch, or a combination thereof.

The metal interconnect structures (46, 48) in the front side dielectric layer 40 includes at least a pair of metal interconnect structures embedded in the front side dielectric layer 40 and abutting the at least one semiconductor device located directly on the front side surface, i.e., the interface between the top semiconductor layer 20 and the front side dielectric layer 40, and the pair of through-substrate vias 52. One of the pair of through-substrate vias 52 is connected to a node of the at least one semiconductor device to which an electrical connection, i.e., a resistive connection, to a first node of a capacitor is needed. The other of the pair of through-substrate vias 52 is connected to a node of the at least one semiconductor device to which an electrical connection, i.e., a resistive connection, to a second node of a capacitor is needed.

The pair of dielectric liners 50 extends from the front side dielectric layer 40 through the top semiconductor layer 20, the buried insulator layer 12, and the bottom semiconductor layer 10m and partly into the sacrificial layer 9, and laterally abuts and laterally surrounds the pair of through-substrate vias 52.

Figure 3A:
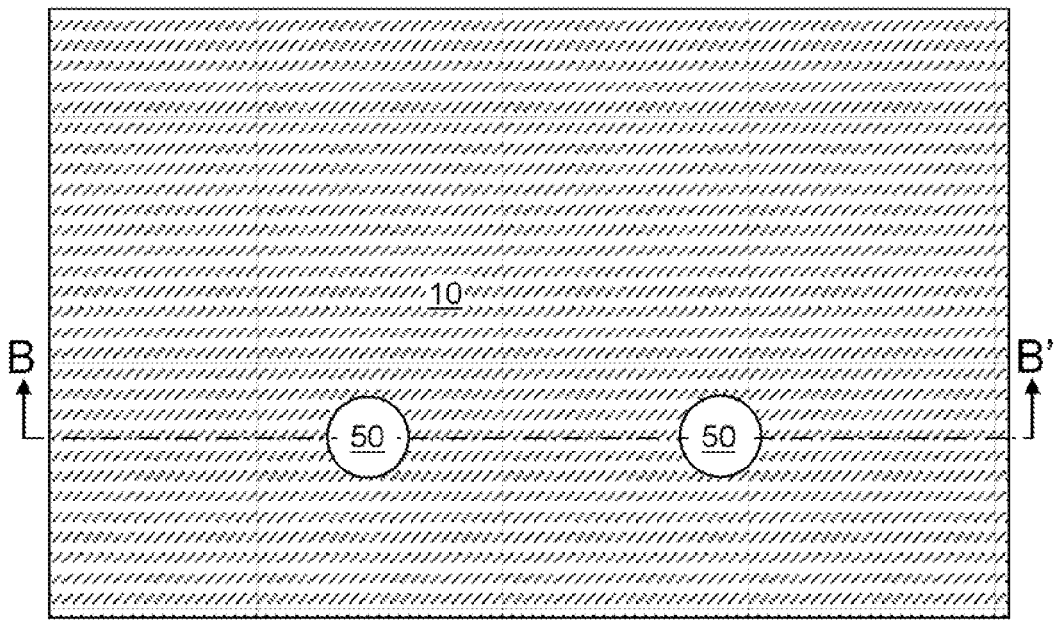
Figure 3B:
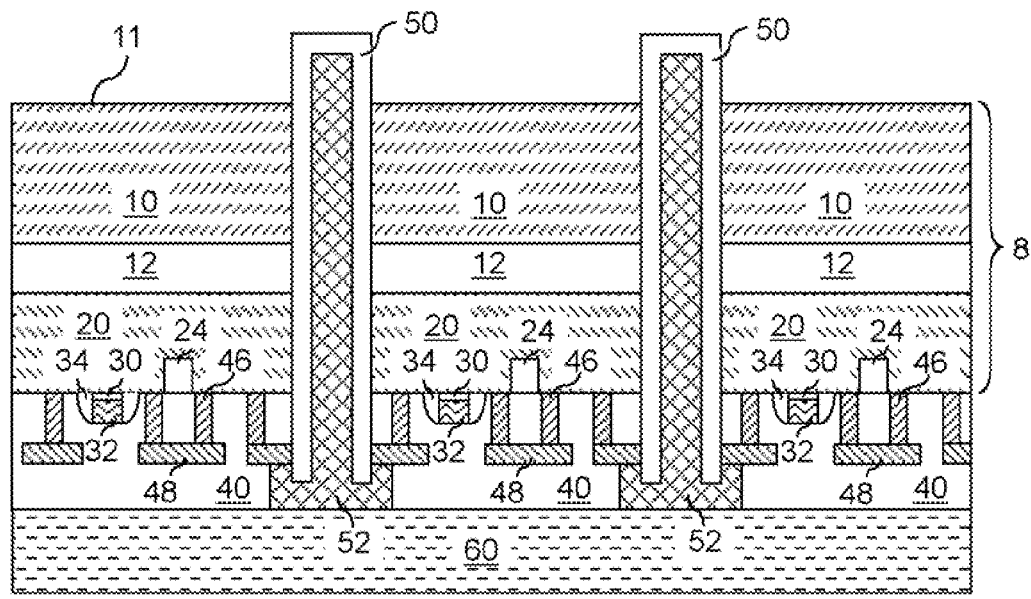

Referring to FIGS. 3A and 3B, a handle substrate 60 may optionally be bonded to the top surface of the front side dielectric layer 40. The handle substrate 60 may include a dielectric material, a semiconductor material, a conductive material, a ceramic material, a plastic material, or a combination thereof. The handle substrate 60 protects the front side dielectric layer 40 from accidental scratching and other mechanical damages. The use of the handle substrate 60 is optional. Embodiments in which a handle substrate is not employed are explicitly contemplated herein.

The first exemplary semiconductor structure is subsequently flipped upside down. The sacrificial layer 9 is removed by a recess etch, chemical mechanical planarization, or a combination thereof. In one case, the sacrificial layer 9 may be removed selective to the pair of dielectric liners 50, for example, by employing an etch that removes the material of the sacrificial layer 9 selective to the material of the pair of dielectric liners 50. For example, if the sacrificial layer 9 includes silicon and the pair of dielectric liners 50 includes silicon oxide or silicon nitride, an etch that removes silicon selective to silicon oxide or silicon nitride may be employed. The entirety of the sacrificial layer 9 is removed. The removal of the sacrificial layer 9 may, or may not, be selective to the bottom semiconductor layer 10. In case the removal of the sacrificial layer 9 is selective to the bottom semiconductor layer 10, the removal process for the sacrificial layer 9 is self-stopping on the bottom surface 11 (now located at the top) of the bottom semiconductor layer 10.

End portions of the pair of dielectric liners 52 protrude above the bottom surface 11 of the bottom semiconductor layer 10. The bottom surface of the bottom semiconductor layer 10 is the back side surface of the semiconductor substrate 8. The height of the protrusion of the pair of dielectric liners 52 above the bottom surface 11 of the bottom semiconductor layer 10 may be from about 100 nm to about 30 μm, and typically from about 300 nm to about 1 μm, although lesser and greater heights are also contemplated herein.

Figure 4A:
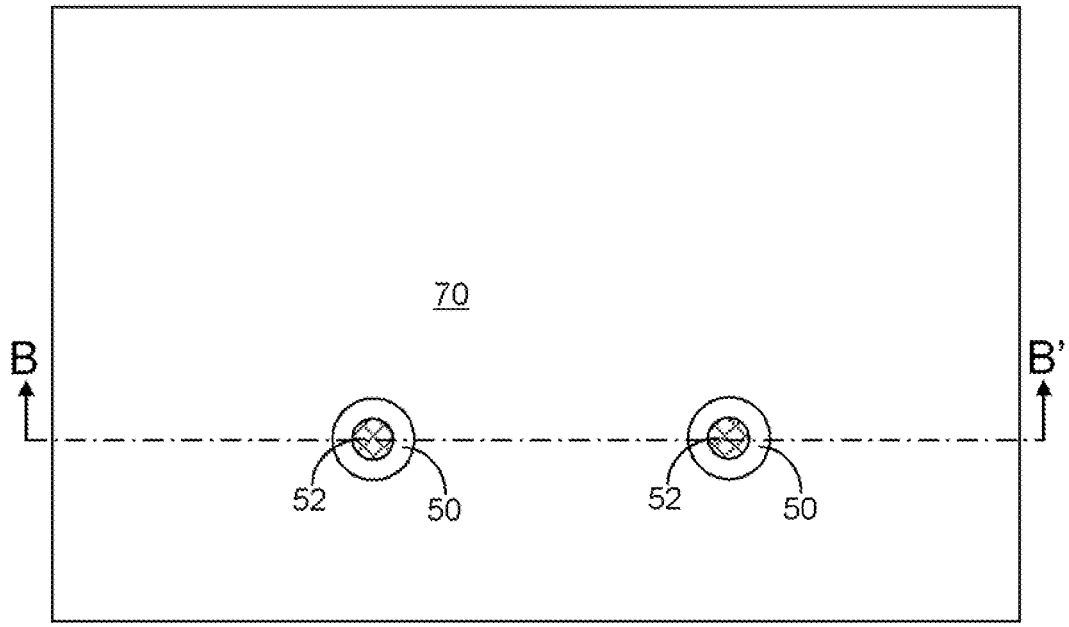
Figure 4B:
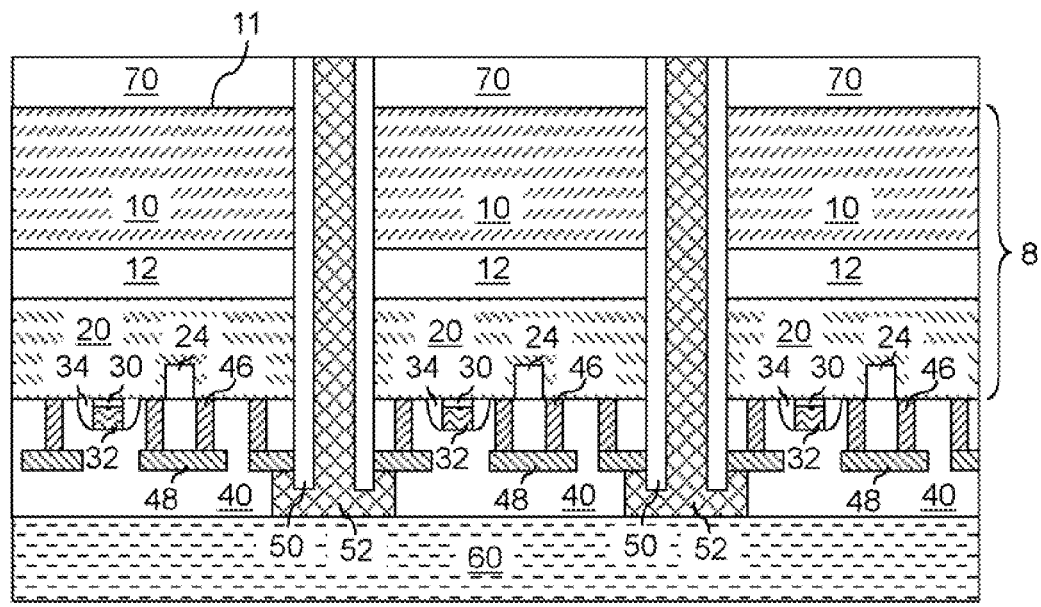

Referring to FIGS. 4A and 4B, a first back side dielectric layer 70 is deposited on the back side surface of the semiconductor substrate 8, which now includes the top semiconductor layer 20, the buried insulator layer 12, and the bottom semiconductor layer 10. The first back side dielectric layer 70 includes a dielectric material such as a dielectric oxide, a dielectric nitride, a dielectric oxynitride, or a combination thereof. For example, the first back side dielectric layer 70 may include silicon oxide ($SiO_2$). The thickness of the first back side dielectric layer 70 may be on the order of the height of the protrusion of the pair of dielectric liners 52 above the bottom surface 11 of the bottom semiconductor layer 10. The first back side dielectric layer 70 and a horizontal portion of the pair of dielectric liners 52 are planarized by chemical mechanical planarization, a recess etch, or a combination thereof to form a substantially horizontal and planar surface, which includes surfaces of the first back side dielectric layer 70, the pair of dielectric liners 50, and the pair of through-substrate vias 52. Each of the pair of dielectric liners 50 becomes cylinder-shaped at this step. The thickness of the first back side dielectric layer 70 after planarization may be from about 100 nm to about 10 μm, and typically from about 300 nm to about 1 μm, although lesser and greater heights are also contemplated herein.

Figure 5A:
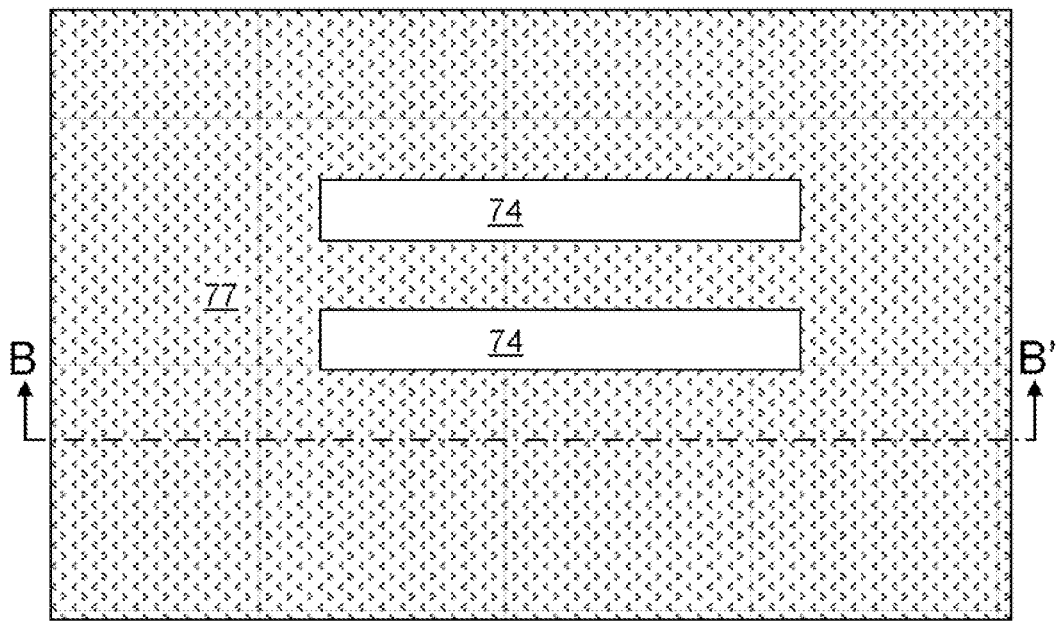
Figure 5B:
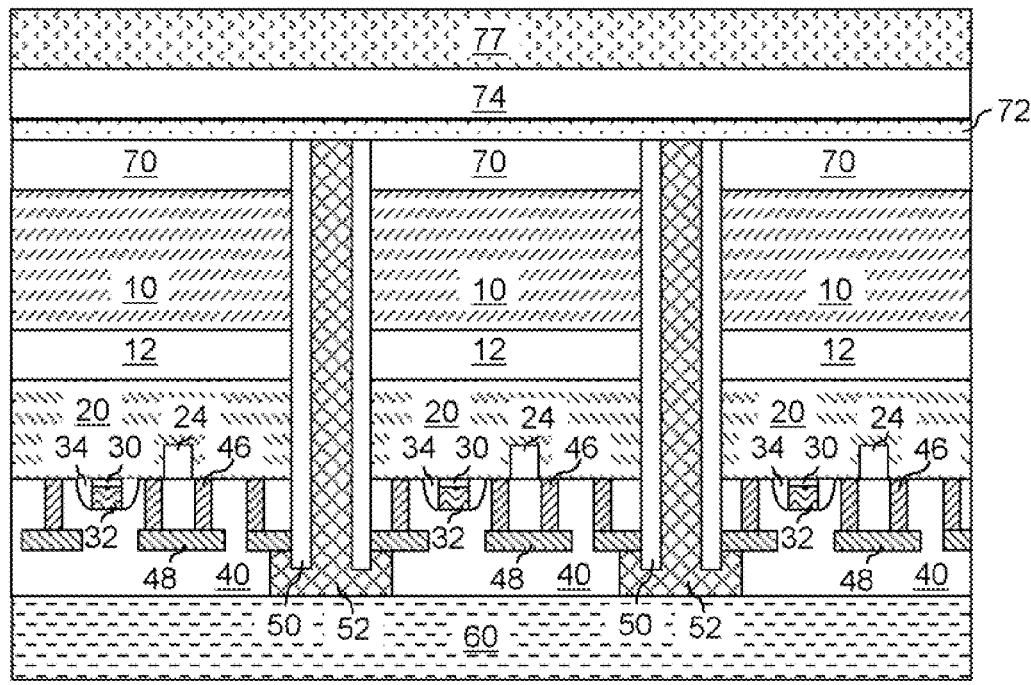
Figure 6A:
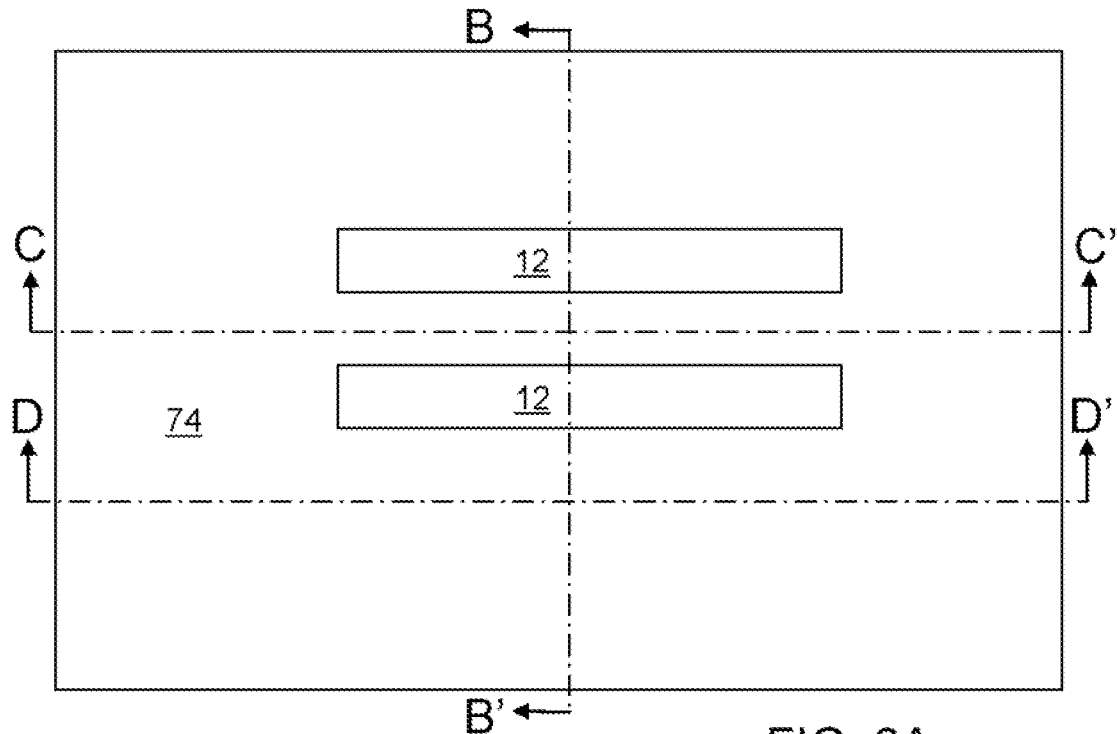
Figure 6B:
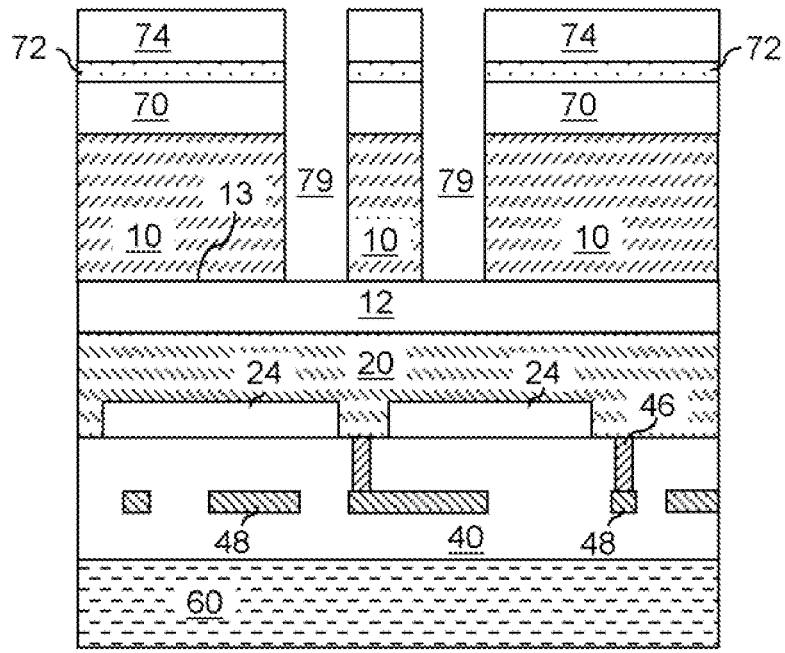
Figure 6C:
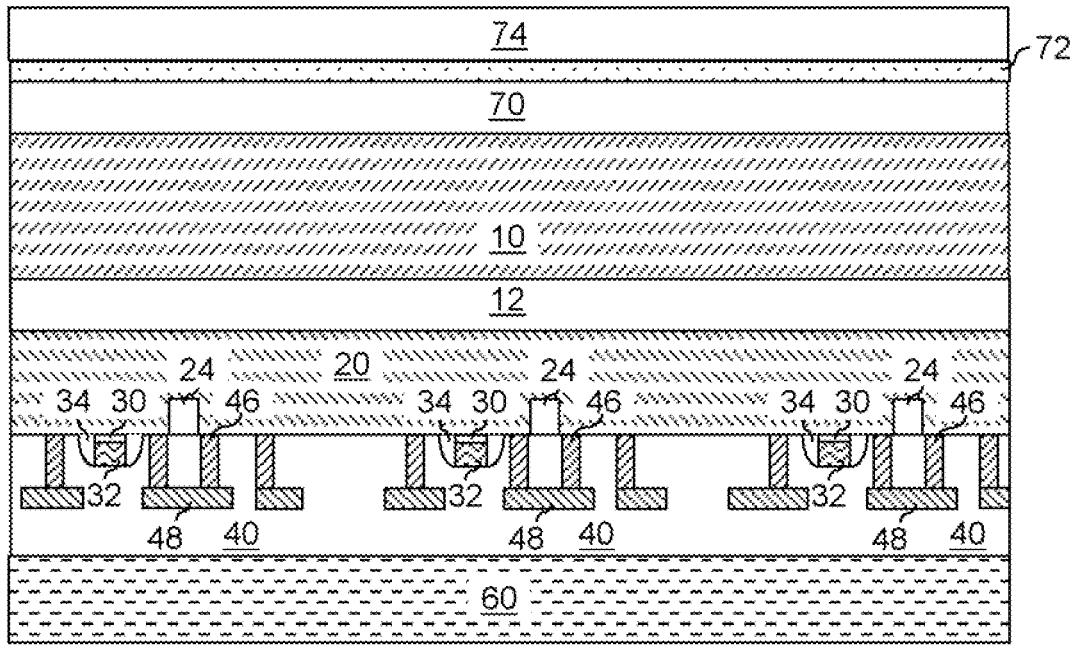
Figure 6D:
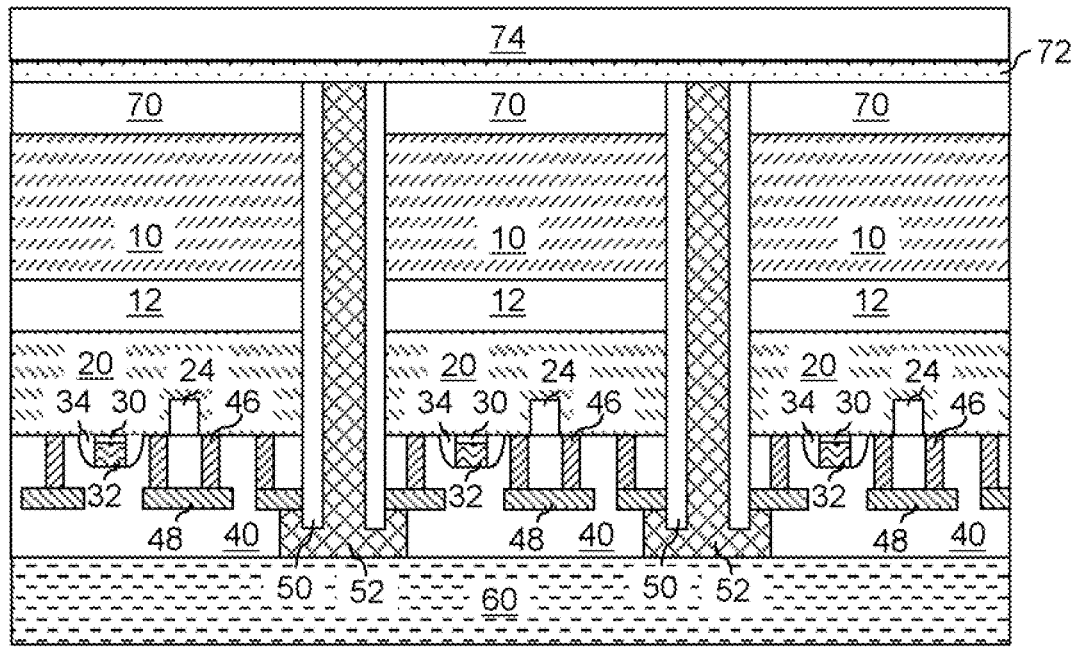
Figure 7A:
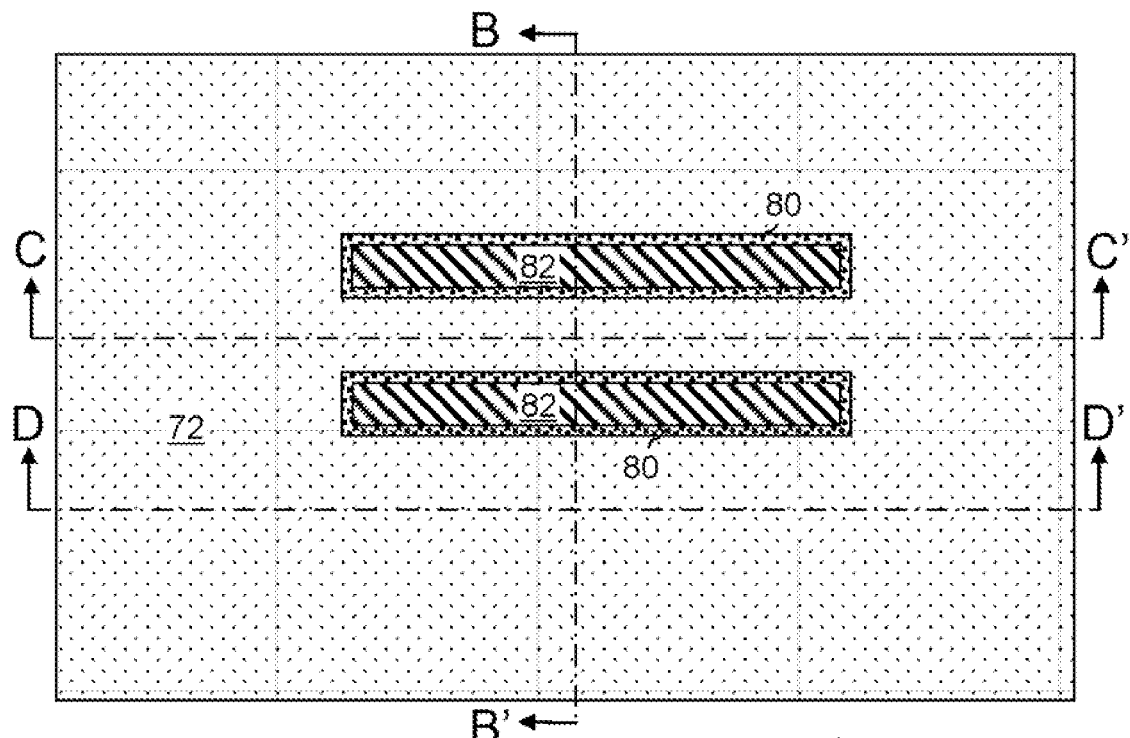
FIGS. 7A-7D correspond to the step after formation of at least one node dielectric and at least one conductive inner electrode.
Figure 7B:
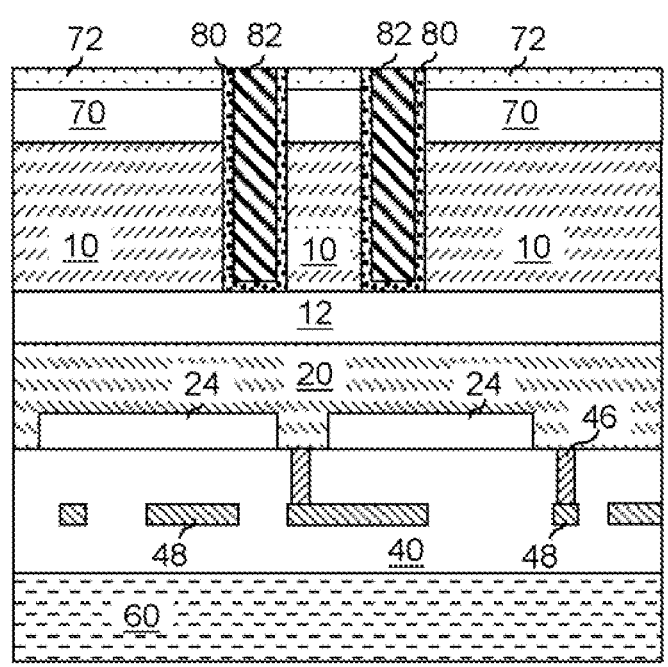
Figure 7C:
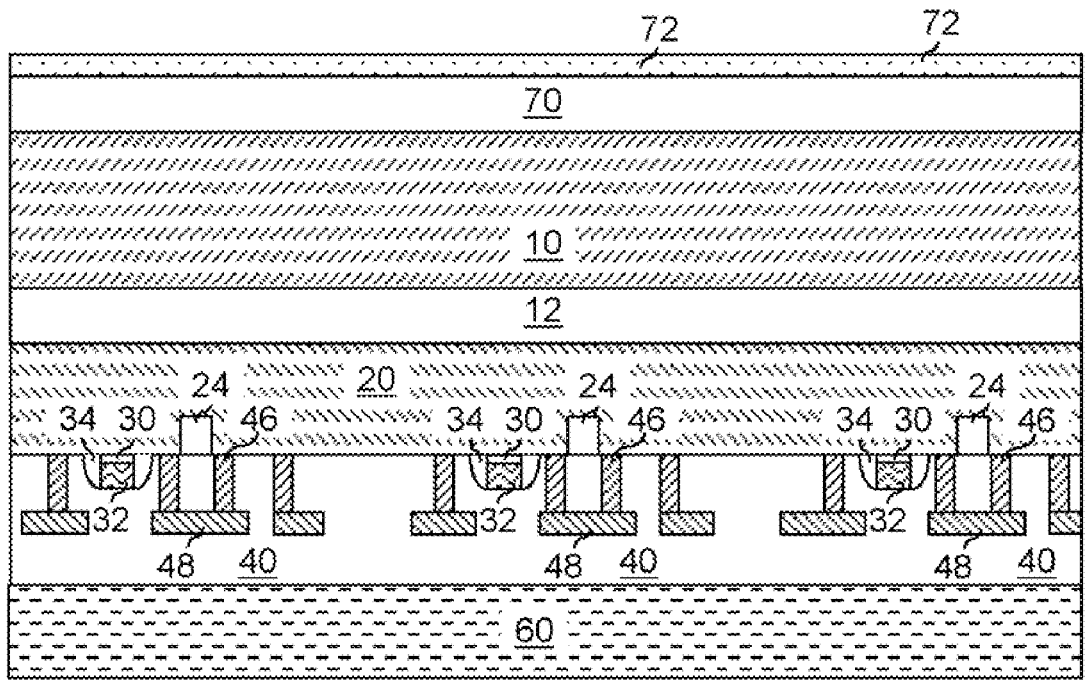
Figure 7D:
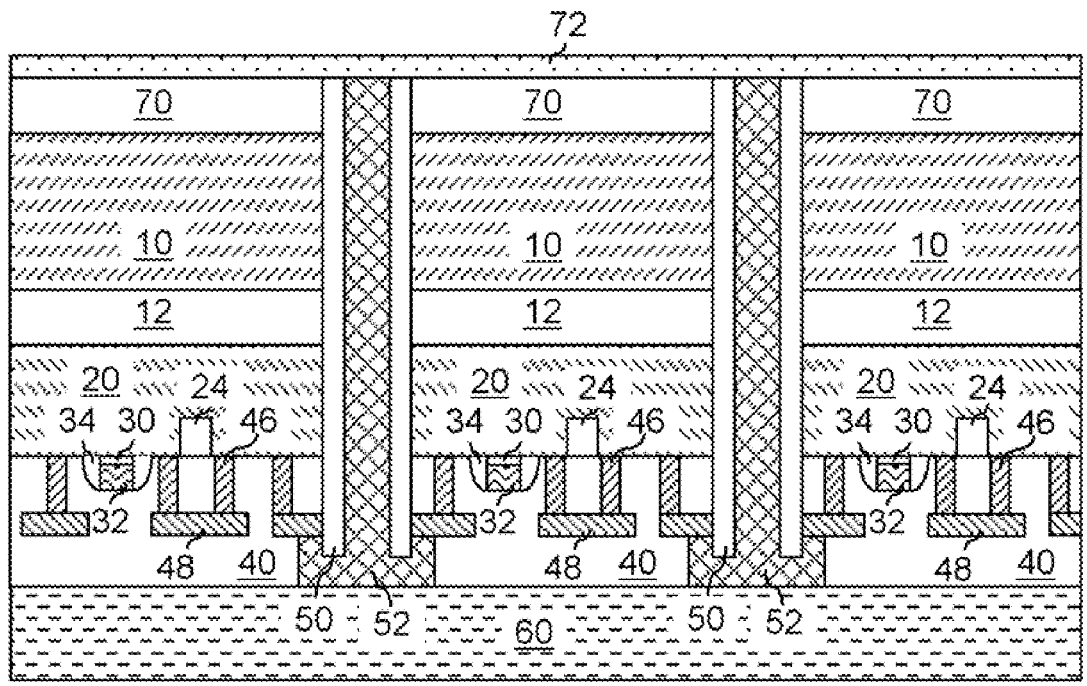
Figure 8A:
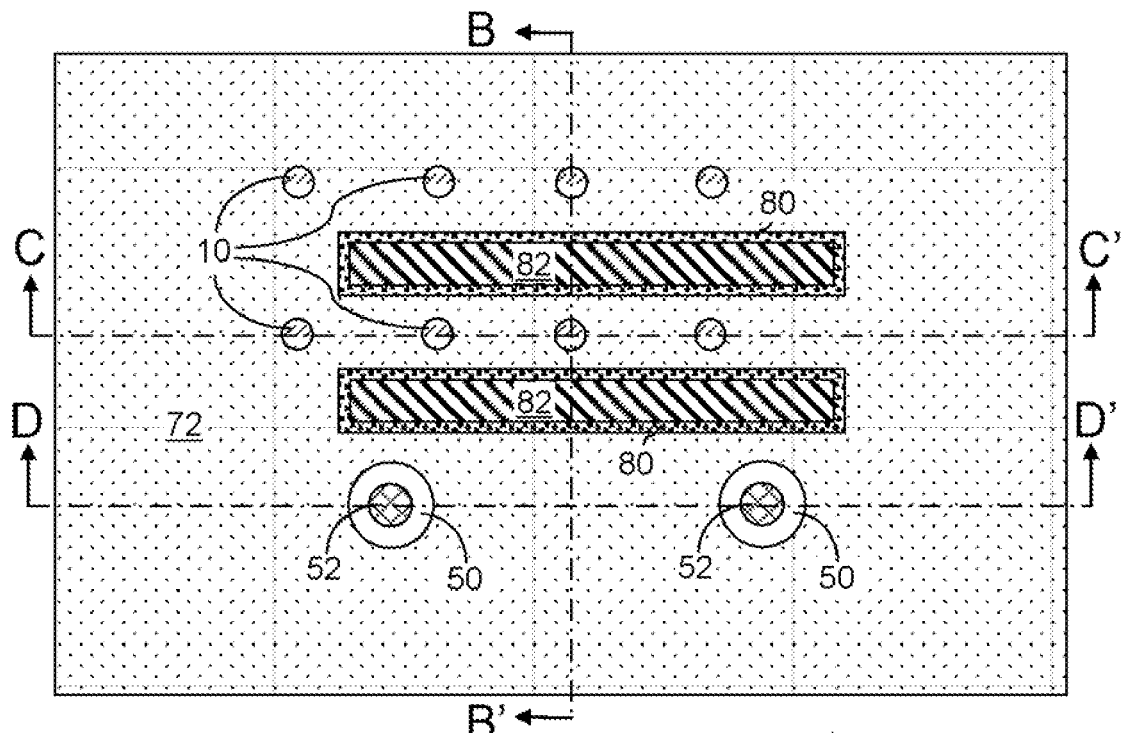
FIGS. 8A-8D correspond to the step after formation of the FIG. 2 is a vertical cross-sectional view of the exemplary semiconductor structure after formation of a buried plate and a buried doped semiconductor layer according to the present invention.
Figure 8B:
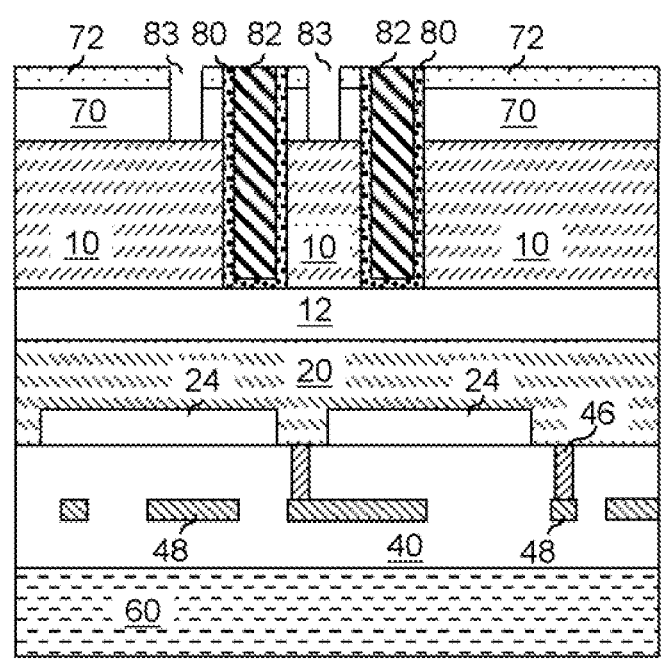
Figure 8C:
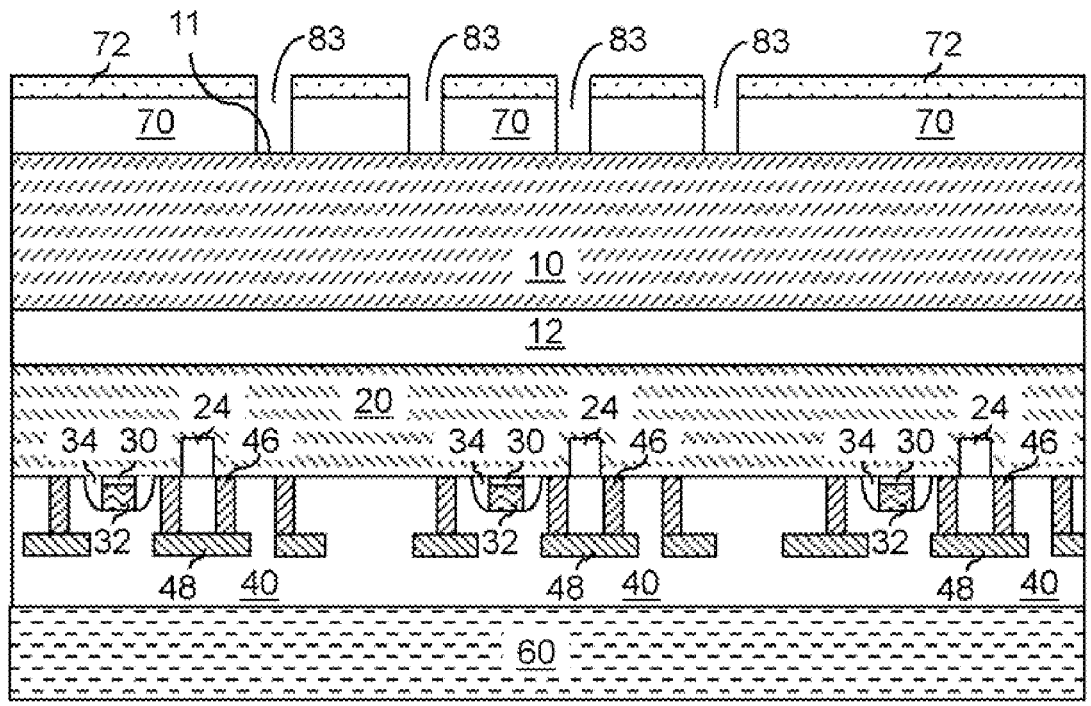
Figure 8D:
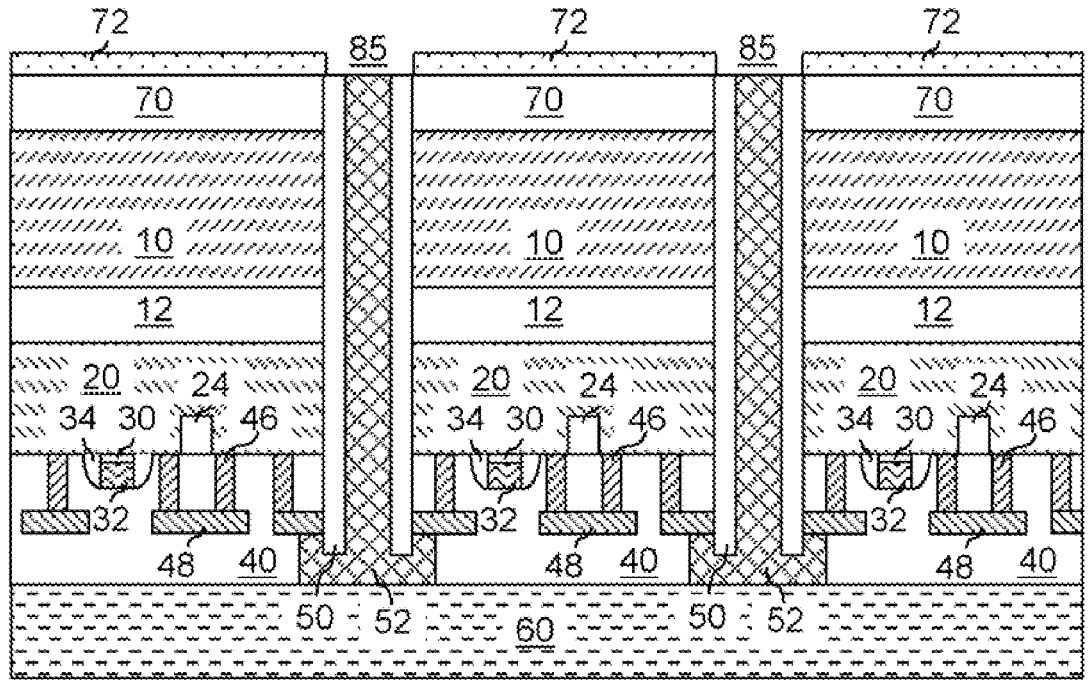
Figure 9A:
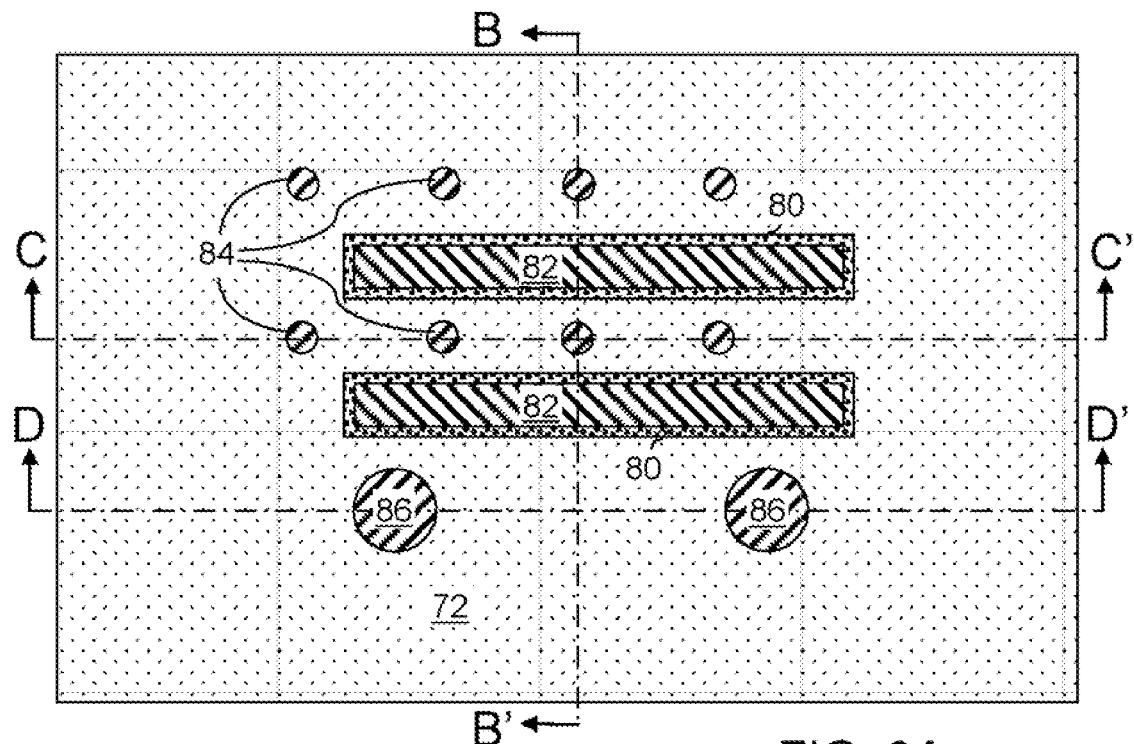
FIGS. 9A-9D correspond to the step after formation of an array of substrate contact vias and through-substrate via plugs.
Figure 9B:
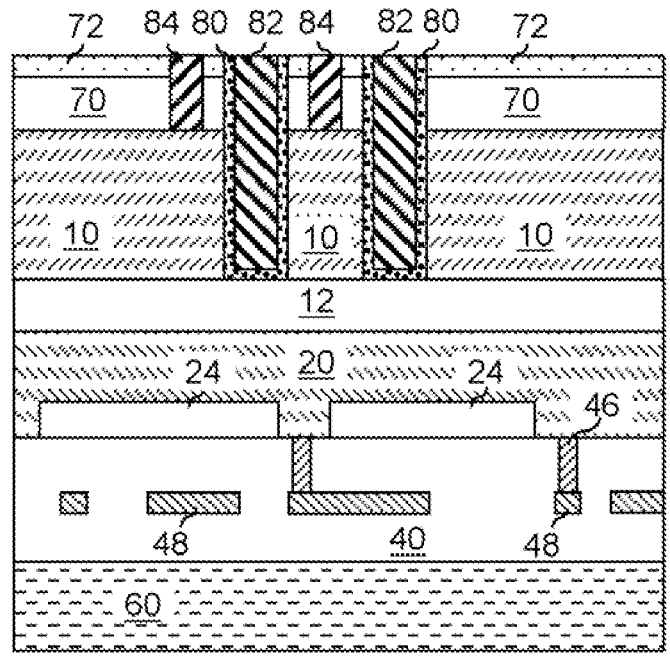
Figure 9C:
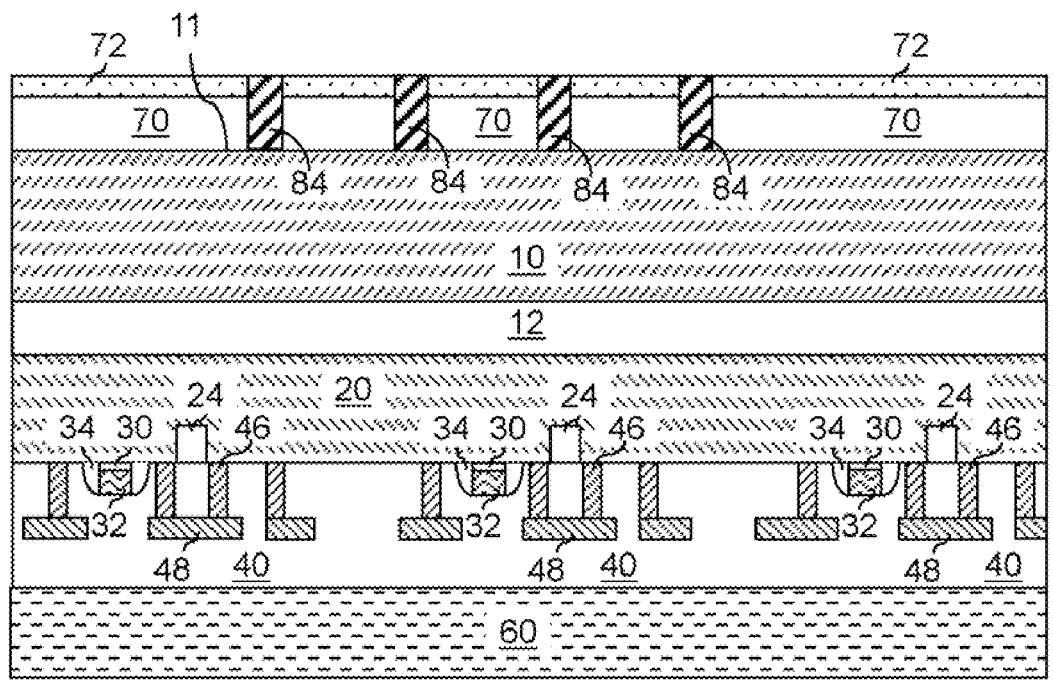
Figure 9D:
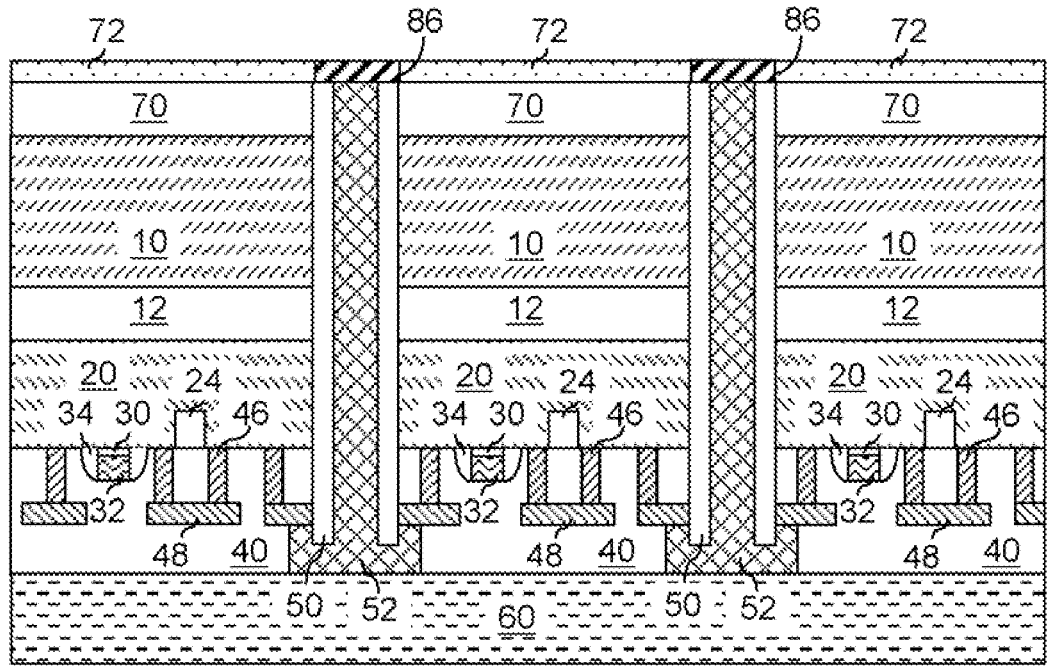
Figure 10A:
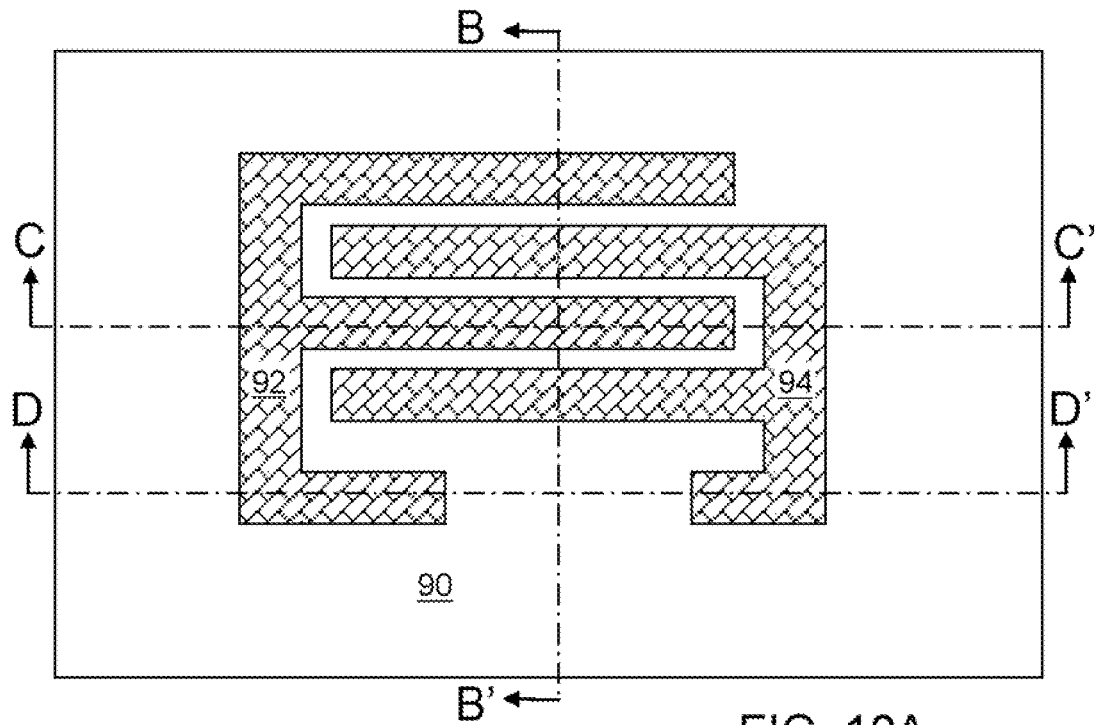
Figure 10B:
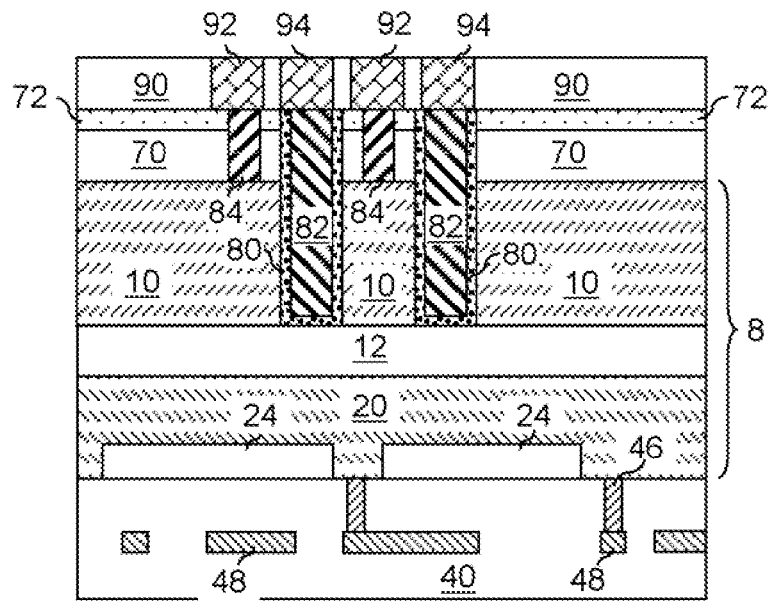
Figure 10C:
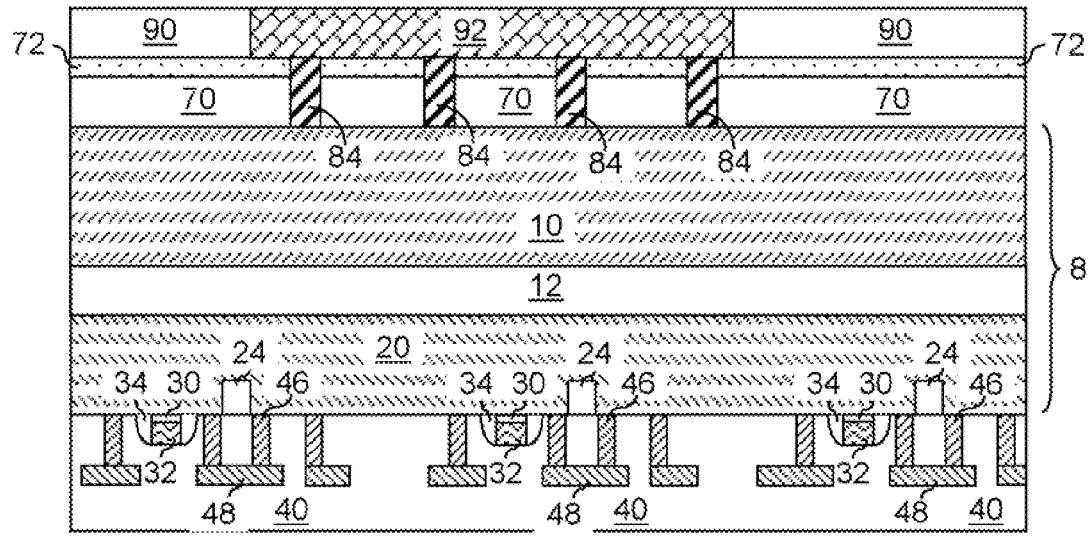
Figure 10D:
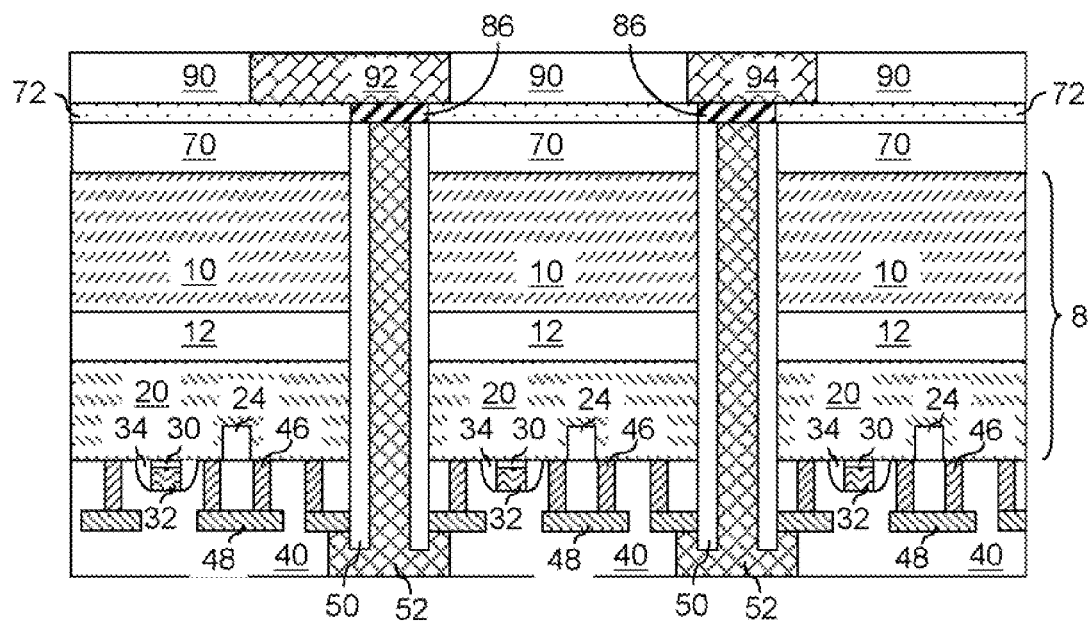
Figure 11A:
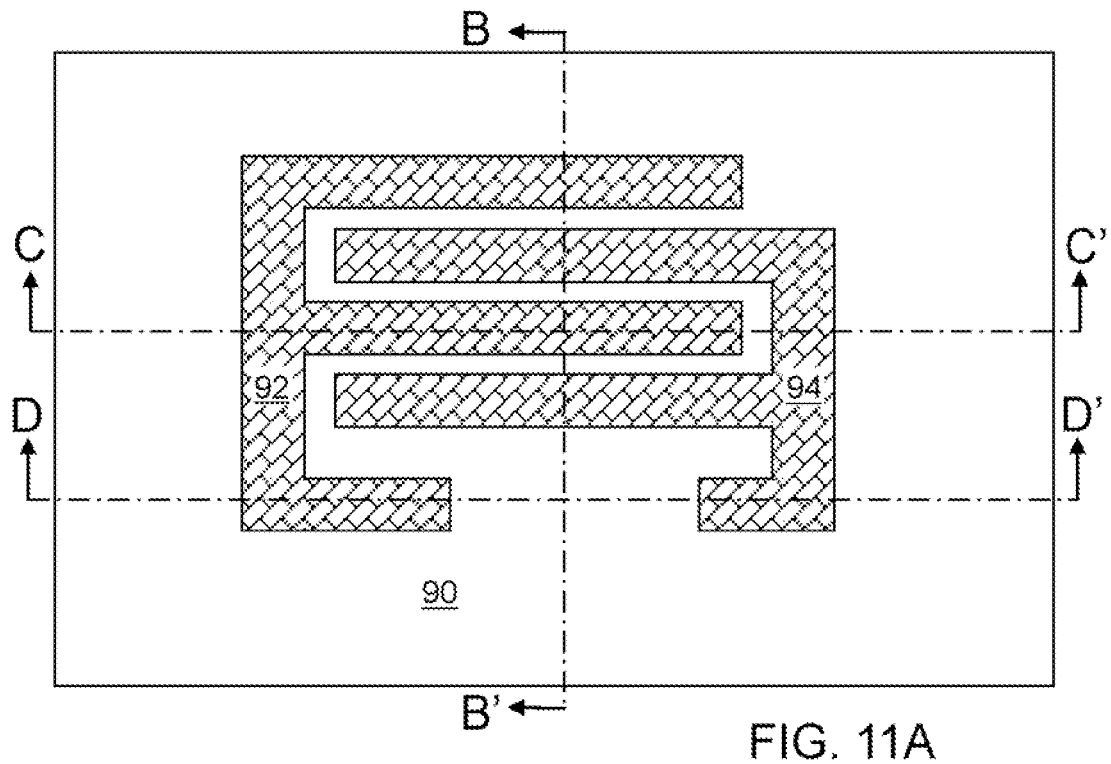
FIGS. 11A-11D are views of a second exemplary semiconductor according to a second embodiment of the present invention.
Figure 11B:
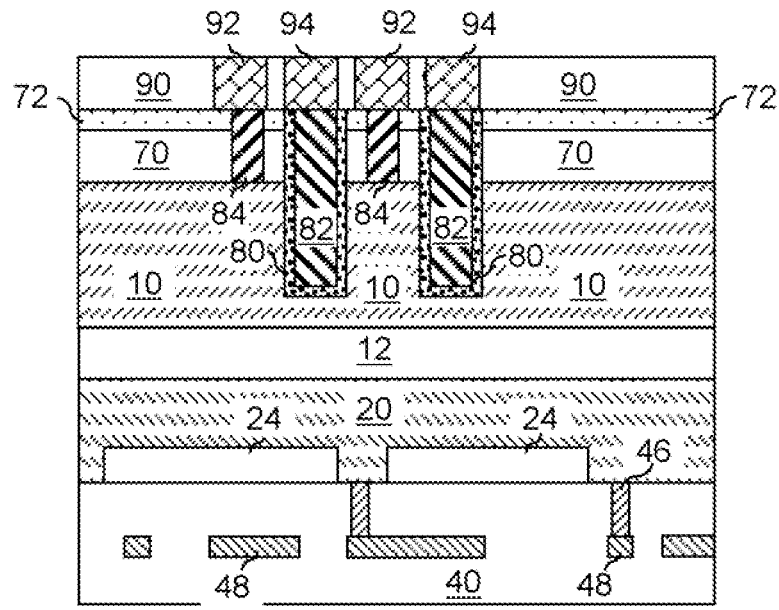
Figure 11C:
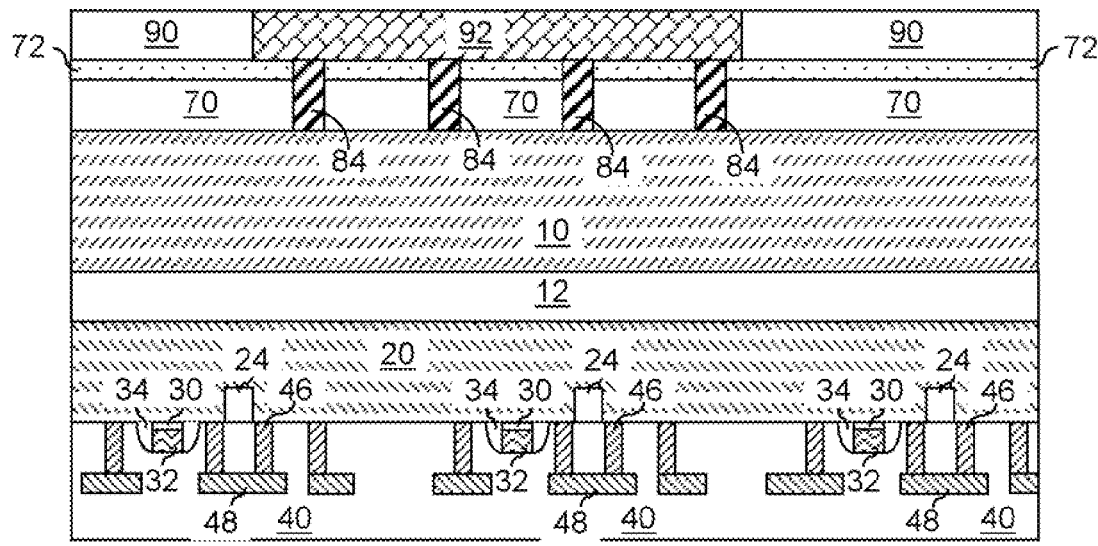
Figure 11D:
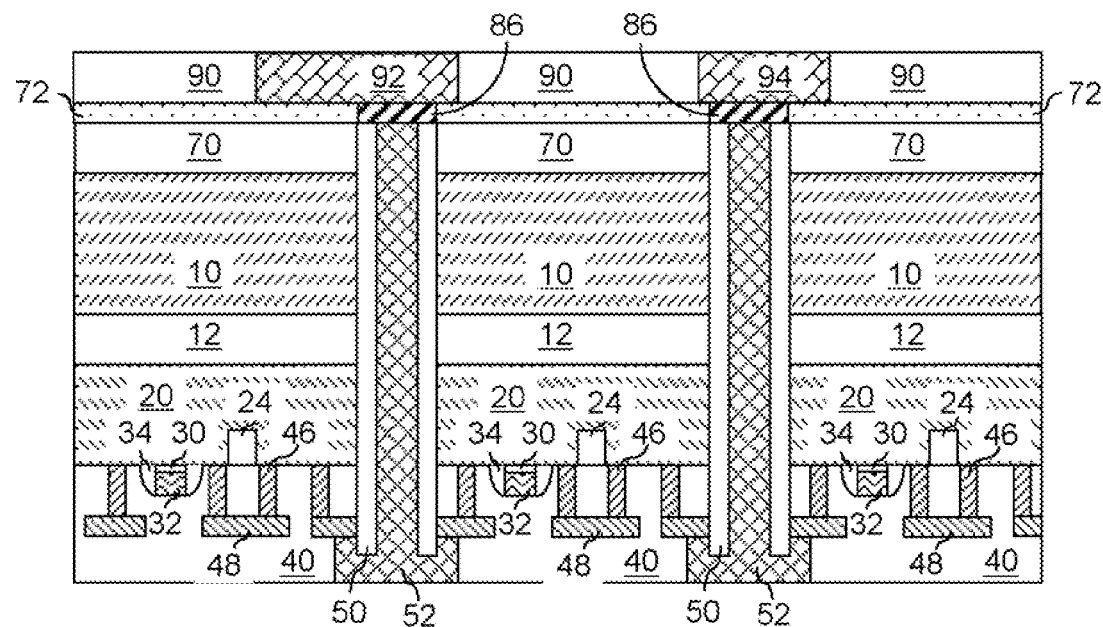
Figure 12A:
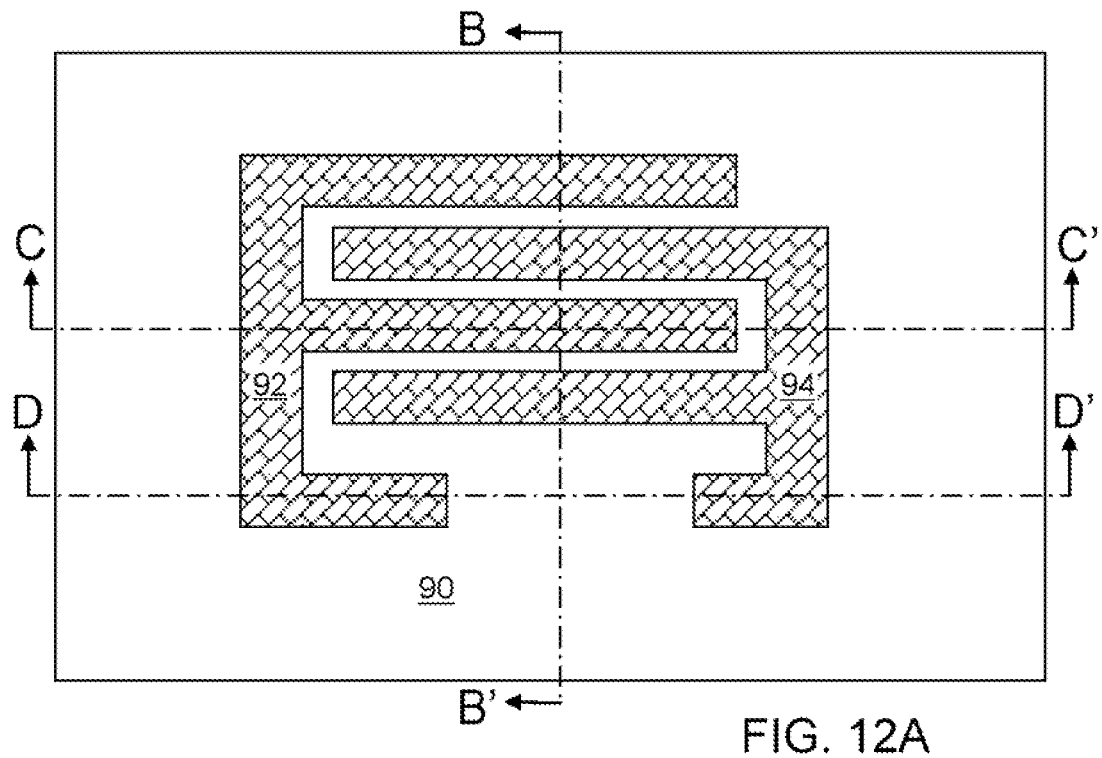
FIGS. 12A-12D are views of a third exemplary semiconductor according to a third embodiment of the present invention.
Figure 12B:
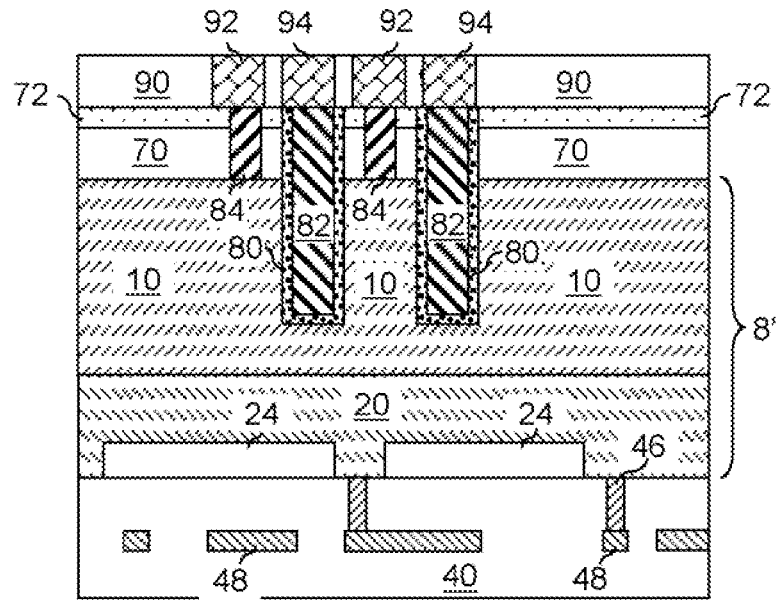
Figure 12C:
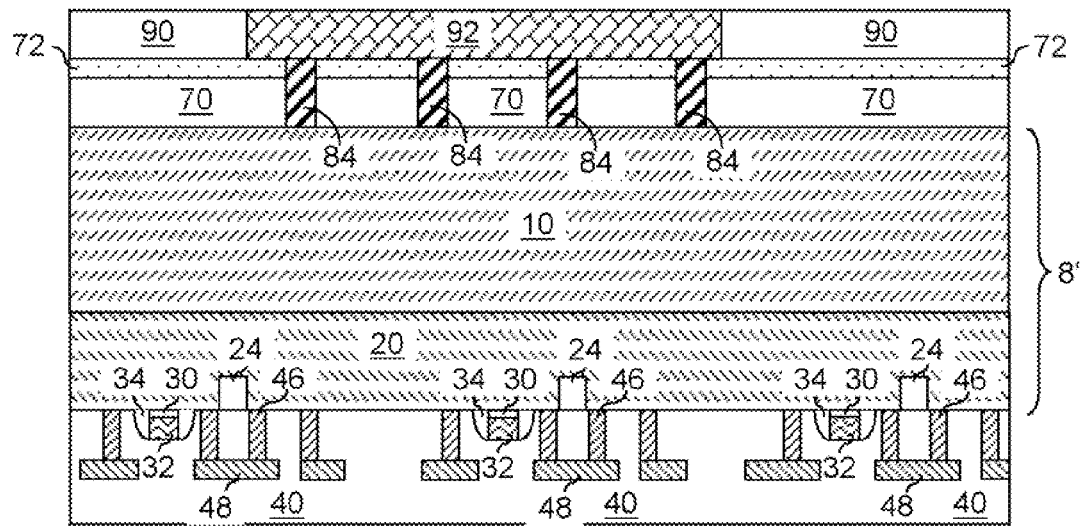
Figure 12D:
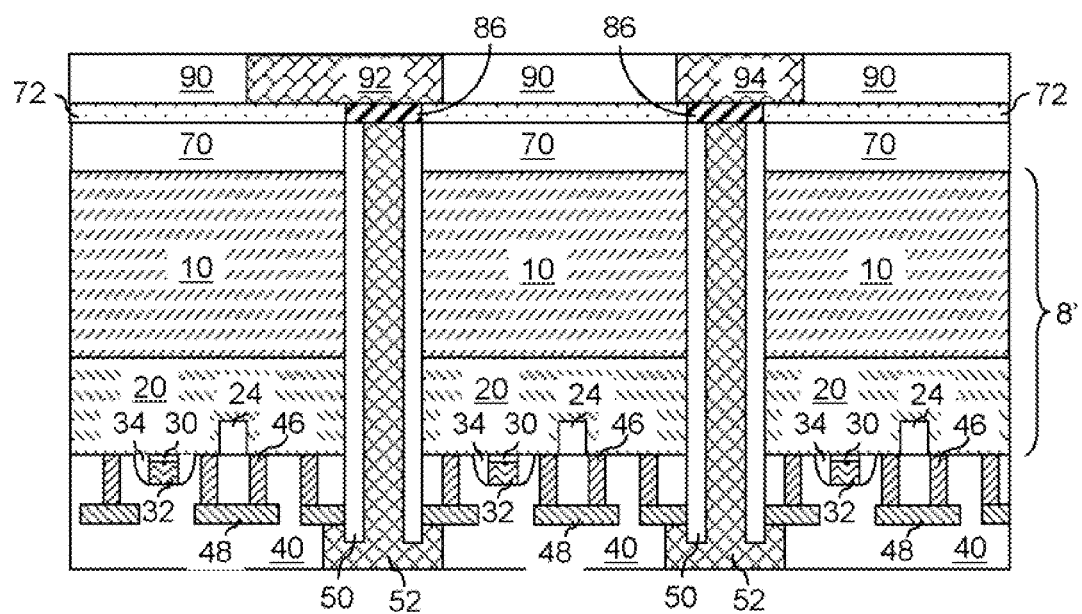

Referring to FIGS. 5A and 5B, a second back side dielectric layer 72, a third back side dielectric layer 74, and a photoresist 77 are applied on the exposed surface of the first back side dielectric layer 70. The second and third back side dielectric layers (72, 74) include dielectric materials such a dielectric oxide, a dielectric nitride, a dielectric oxynitride, etc. For example, the second back side dielectric layer 72 may include silicon nitride, and the third back side dielectric layer 74 may include silicon oxide. The thickness of the second back side dielectric layer 72 may be from about 100 nm to about 300 nm, and the thickness of the third back side dielectric layer may be from about 100 nm to about 1,000 nm, although lesser and greater thicknesses are explicitly contemplated for each of the second and third back side dielectric layers (72, 74). The third back side dielectric layer 74 may be employed as a hard mask in a subsequent etch that is employed to form at least one trench. The second back side dielectric layer 72 may be employed as a stopping layer in a subsequent planarization process. While the present invention is described with the first, second, and third back side dielectric layers (70, 72, 74), embodiments employing a fewer number of dielectric layers or a greater number of dielectric layers are explicitly contemplated herein.

At least one opening is formed in the photoresist 77 by lithographic exposure and development. The area of the at least one opening corresponds to the area of at least one deep trench to be subsequently formed in the bottom semiconductor layer 10. Each of the at least one opening may have a shape of a circle, ellipse, a curvilinear closed shape, a rectangle, a polygon, or any closed shape that may be obtained by combining portions of at least one curvilinear shape with a portions of a polygonal shape. For example, each of the at least one opening may be a rectangle. The lateral dimensions of the at least one opening, e.g., a length or a width of the sides of a rectangle, may be from about 200 nm to about 50 mm, and typically from about 500 nm to about 10 mm, although lesser and greater dimensions are also contemplated herein.

Referring to FIGS. 6A-6D, the pattern in the photoresist 77 is transferred through the third back side dielectric layer 74, the second back side dielectric layer 72, and the first back side dielectric layer 70, and into the bottom semiconductor layer 10 to form at least one deep trench 79. An anisotropic etch is employed to transfer the pattern in the opening of the photoresist 77 into the first through third back side dielectric layers (70, 72, 74) and the bottom semiconductor layer 10. Typically, the photoresist 77 is completely consumed during the anisotropic etch, and the third back side dielectric layer 74, which is patterned through prior to the complete consumption of the photoresist 77, functions as a hard mask during the etching of the bottom semiconductor layer 10 and optionally during the etching of the second and/or first back side dielectric layer(s) (70, 72).

The etch of the bottom semiconductor layer 10 may proceed until a surface of the buried insulator layer 12 is exposed. In this case, the at least one deep trench 79 extends to the interface 13 between the bottom semiconductor layer 10 and the buried insulator layer 12, which is the top surface of the bottom semiconductor layer 10 located above the volume of the bottom semiconductor layer 10 in the inverted first exemplary semiconductor structure. In this case, the depth of the at least one deep trench 79 is the sum of the thicknesses of the first through third back side dielectric layers (70, 72, 74) and the thickness of the bottom semiconductor layer 10.

The sidewalls of the at least one deep trench 79 may be substantially vertical. However, taper angles from 0 degree to about 5 degrees in the sidewalls of the at least one deep trench 79 are also explicitly contemplated herein. The third dielectric layer 74 is subsequently removed selective to the second dielectric layer 72 and optionally selective to the material of the bottom semiconductor layer 10.

Referring to FIGS. 7A-7D, a node dielectric layer is deposited directly on the bottom surface and sidewalls of the at least one deep trench 79. A conductive material is subsequently deposited on the surfaces of the node dielectric layer including the sidewalls and a recessed surface of the node dielectric layer within the at least one deep trench 79. Excess materials above the upper surface of the second back side dielectric layer 72 is removed, for example, by chemical mechanical planarization, a recess etch, or a combination thereof. The upper surface of the second back side dielectric layer 72 herein refers to the planar surface of the second back side dielectric layer 72 that does not vertically abut the first back side dielectric layer 70. The second back side dielectric layer 72 may be employed as a stopping layer during the planarization of the excess material of the node dielectric layer and the conductive material from above the upper surface of the second back side dielectric layer 72. The remaining portion(s) of the node dielectric layer constitute(s) the at least one node dielectric 80. The remaining portion(s) of the conductive material constitute(s) the at least one conductive inner electrode 80.

The at least one node dielectric 80 includes a dielectric material such as silicon nitride, silicon oxide, silicon oxynitride, a dielectric metal oxide, a dielectric metal nitride, a dielectric metal oxynitride, a silicate alloy of a dielectric metal oxide, a silicate alloy of a dielectric metal nitride, a silicate alloy of a dielectric metal oxynitride, or an alloy or mixture thereof. The dielectric material may be deposited by plasma enhanced chemical vapor deposition (PECVD), thermal chemical vapor deposition, high density plasma chemical vapor deposition (HDPCVD), metal-organic chemical vapor deposition (MOCVD), thermal conversion of a semiconductor material into a dielectric material such as thermal nitridation or thermal oxidation, plasma enhanced conversion of a semiconductor material into a dielectric material such as plasma nitridation or plasma oxidation, etc.

For example, the at least one node dielectric 80 may include silicon oxide, silicon nitride, a high-k material having a dielectric constant greater than the dielectric constant of silicon nitride, or any suitable combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the at least one node dielectric 80 may be from about 3 nm to about 10 nm, although lesser and greater thickness are also explicitly contemplated herein.

The at least one conductive inner electrode 82 may include a doped semiconductor material, a metal, a conductive metal nitride, or an alloy or mixture thereof. For example, the at least one conductive inner electrode 82 may include Cu, Al, W, Ta, Ti, Ni, WN, TaN, TiN, etc. The at least one conductive inner electrode 82 may be formed by electroplating, physical vapor deposition (PVD), electroless plating, chemical vapor deposition, or a combination thereof. For example, the at least one conductive electrode 82 may be formed by physical vapor deposition of a seed layer of Cu, followed by electroplating of Cu.

Since the node dielectric layer is deposited directly on the buried insulator layer 12, the node dielectric 80 vertically abuts the buried insulator layer 20.

Referring to FIGS. 8A-8D, an array of via holes 83 and a pair of recess trenches 85 are formed by lithographic methods and a pattern transfer. Specifically, a photoresist (not shown) is applied over the exposed surface of the second back side dielectric layer 72 and lithographically patterned to form an array of openings in the photoresist and a pair of openings in the photoresist. The array of openings are formed in areas that does not overlie the at least one conductive inner electrode 82, the at least one node dielectric 80, the pair of dielectric liners 50, or the pair of through-substrate vias 52. The pair of openings in the photoresist is formed in areas that overlie the pair of dielectric liners 50 or the pair of through-substrate vias 52. An etch is employed to remove the material of the second back side dielectric layer 72 and the first back side dielectric layer 70 from underneath the array of openings and the pair of openings in the photoresist. The array of via holes 83 is formed directly underneath the array of openings in the photoresist. The pair of recess trenches 85 is formed directly underneath the pair of openings in the photoresist. The etch may be an isotropic etch or an anisotropic etch. In case the etch is an anisotropic etch, the sidewalls of the array of via holes 83 may be substantially vertically coincident with the sidewalls of the photoresist in the array of openings. Likewise, the sidewalls of the pair of recess trenches 85 may be substantially vertically coincident with the sidewalls of the photoresist in the pair of openings in the photoresist. The photoresist is subsequently removed.

The bottom surface 11 of the bottom semiconductor layer 10 is exposed underneath each of the array of via holes 83. Planar end surfaces of the pair of through-substrate vias 52 are exposed at the bottom of the pair of recess trenches 85. The planar end surfaces of the pair of through-substrate vias 52 are substantially planar with the interface between the first back side dielectric layer 70 and the second back side dielectric layer 72.

Referring to FIGS. 9A-9D, another conductive material is subsequently deposited on the exposed surfaces including the bottom surfaces and sidewalls of the array of via holes 83 and the pair of recess trenches 85. Excess materials above the upper surface of the second back side dielectric layer 72 is removed, for example, by chemical mechanical planarization, a recess etch, or a combination thereof. The second back side dielectric layer 72 may be employed as a stopping layer during the planarization of the excess conductive material from above the upper surface of the second back side dielectric layer 72, i.e., from the surface of the second dielectric layer 72 that does not abut the first back side dielectric layer 70. The remaining portions of the conductive material filling the array of via holes 83 constitute an array of substrate contact vias 84 which vertically abut the bottom surface 11 of the bottom semiconductor layer 10. The remaining portions of the conductive material filling the pair of recess trenches 85 constitute a pair of through-substrate via plugs 86 that vertically abuts the pair of through substrate vias 52.

The array of substrate contact vias 84 and the pair of through-substrate via plugs 86 may include a doped semiconductor material, a metal, a conductive metal nitride, or an alloy or mixture thereof. For example, the array of substrate contact vias 84 and the pair of through-substrate via plugs 86 may include Cu, Al, W, Ta, Ti, Ni, WN, TaN, TiN, etc. The array of substrate contact vias 84 and the pair of through-substrate via plugs 86 may be formed by electroplating, physical vapor deposition (PVD), electroless plating, chemical vapor deposition, or a combination thereof. For example, the array of substrate contact vias 84 and the pair of through-substrate via plugs 86 may be formed by physical vapor deposition of a seed layer of Cu, followed by electroplating of Cu. The exposed surfaces of the array of substrate contact vias 84 and the pair of through-substrate via plugs 86 are substantially coplanar with the upper surface of the second back side dielectric layer 72, which is the exposed surface of the second back side dielectric layer 72.

Referring to FIGS. 10A-10D, a first conductive wiring structure 92 and a second conductive wiring structure 94 are formed. The first and second wiring structures (92, 94) may be formed by a damascene method by first depositing a back side dielectric layer 90, application of a photoresist (not shown), lithographic patterning of lines, transfer of the lithographic pattern into the back side dielectric layer 90 to form line troughs, filling of the line troughs with a conductive material, and a subsequent planarization of the conductive material. In this case, the back side dielectric layer 90 may include any dielectric material that may be employed for the front side dielectric layer 40 as described above. The thickness of the back side dielectric layer 90 may be from about 100 nm to about 5,000 nm, and typically from about 300 nm to about 2,000 nm. The conductive material may be any of the material that may be employed for the array of substrate contact vias 84 and the pair of through-substrate via plugs 86. For example, the conductive material may include Cu. The planarization process removed the excess conductive material from above the upper surface of the back side dielectric layer 90, i.e., from above the surface of the back side dielectric layer 90 that does not vertically abut the second back side dielectric layer 72. Thus, the thickness of the first conductive wiring structure 92 and the second conductive wiring structure 94 is the same as the thickness of the back side dielectric layer 90.

The first conductive wiring structure 92 vertically abuts the array of substrate contact vias 84 and one of the pair of through-substrate via plugs 86. The second conductive wiring structure 94 vertically abuts the at least one conductive inner electrode 82 and the other of the pair of the through-substrate via plugs 86. A first resistive electrical coupling, i.e., electrical coupling provided through resistive connections, is provided from the bottom semiconductor layer 10, through the array of substrate contact vias 84, the first conductive wiring structure 92, one of the pair of the through-substrate via plugs 86, one of the pair of through-substrate vias 52, one of metal interconnect structures (46, 48) embedded in the front side dielectric layer 40, to a node of the at least one semiconductor device located directly on the front side surface of the semiconductor substrate 8, i.e., directly on the top surface of the top semiconductor layer 20. A second resistive electrical coupling is provided from the at least one inner electrode 82, through the second conductive wiring structure 94, the other of the pair of the through-substrate via plugs 86, the other of the pair of through-substrate vias 52, another of the metal interconnect structures (46, 48), to another node of the at least one semiconductor device.

The at least one conductive inner electrode 82, the at least one node dielectric 80, and the bottom semiconductor layer 10 collectively constitute a capacitor. The at least one conductive inner electrode 82 functions as a first electrode of the capacitor, the at least one node dielectric 80 functions as the node dielectric of the capacitor, and the bottom semiconductor layer 10 functions a second electrode of the capacitor. The heavy doping of the bottom semiconductor layer 10 provides a low resistance for the second electrode. The area of the capacitor is the total contact area between the at least one node dielectric 80 and the bottom semiconductor layer, which is approximately the product of the total lateral circumference of the at least one node dielectric 80 and the thickness of the bottom semiconductor layer 10. Since the thickness of the bottom semiconductor layer 10 may be from about 400 µm to about 1,000 µm, a large capacitance compared to any single deep trench formed by conventional methods may be obtained. It is noted that deep trenches formed by conventional methods have a depth not exceeding 10 µm.

The first conductive wiring structure 92 and the second conductive wiring structure 94 may be formed by alternate methods. For example, formation of the back side dielectric layer 90 may be omitted. Instead, a blanket layer of a conductive material may be deposited on the exposed surface of the second back side dielectric layer 72. The blanket layer of the conductive material may be subsequently lithographically patterned to form the first conductive wiring structure 92 and the second conductive wiring structure 94. In this case, the first conductive wiring structure 92 and the second conductive wiring structure 94 are formed by deposition of a blanket conductive layer and a subsequent lithographic patterning without employing a damascene method.

Alternate wiring schemes and/or alternate wirings structures may be employed instead of formation of the array of substrate contact vias 84, the through-substrate via plugs 86, and the first and second conductive wiring structures (92, 94) as separate conductive structures. For example, a single deposition may be employed so that all of the array of substrate contact vias 84, the through-substrate via plugs 86, and the first and second conductive wiring structures (92, 94) are formed by a single deposition step and a single patterning step. In this case, the array of substrate contact vias 84, the first conductive wiring structure 92, and one of the through-substrate via plugs 86 may be formed integrally as a single conductive piece without a physically manifested interface therebetween. Likewise, the second conductive wiring structure 94 and the other of the through-substrate via plugs 86 may be formed integrally as a single conductive piece.

The handle substrate 60, which is provided to protect the front side dielectric layer 40 and the structures therein, may be removed at this step, for example, by cleaving or etching.

Referring to FIGS. 11A-11D, a second exemplary semiconductor according to a second embodiment of the present invention is derived from the first exemplary semiconductor structure according to the first embodiment of the present invention as shown in FIGS. 5A and 5B. At the processing step corresponding to FIGS. 6A-6D, the etch process is terminated before the bottom surface of the deep trench 79 reaches the interface 13 (See FIG. 6B) between the bottom semiconductor layer 10 and the buried insulator layer 12. Thus, the buried insulator layer 12 is not exposed at the bottom of the deep trench 79 after the etch. The same processing steps are subsequently employed as in the first embodiment. The at least one node dielectric 80 does not abut the buried dielectric layer 10. The capacitance of the capacitor including the at least one conductive inner electrode 82, the at least one node dielectric 80, and the bottom semiconductor layer 10 may be adjusted by tuning the depth of the etch without altering any mask or other processing steps.

Referring to FIGS. 12A-12D, a third exemplary semiconductor according to a third embodiment of the present invention is derived from the first exemplary semiconductor structure according to the first embodiment of the present invention by altering the semiconductor substrate 8 of the first embodiment, which is an SOI substrate, to a bulk semiconductor substrate 8'. The buried insulator layer of the first embodiment is eliminated, and the top semiconductor layer 20 vertically abuts the bottom semiconductor layer 10. Typically, the entirety of the top semiconductor layer 20 is epitaxially aligned to the bottom semiconductor layer 10. In one embodiment, a bulk substrate comprising a bottom semiconductor layer 10 may be employed to epitaxially grow a lightly doped semiconductor layer, which becomes the top semiconductor layer 20. Typically, the top semiconductor layer 20 is a lightly doped semiconductor layer, and the bottom semiconductor layer 10 is a heavily doped semiconductor layer. The top semiconductor layer 20 and the bottom semiconductor layer 10 may be independently p-doped or n-doped.

The thickness of the top semiconductor layer 20 may be from about 100 nm to about 20 µm, and typically from about 500 nm to about 5 mm, although lesser and greater thicknesses are also contemplated herein. The thickness of other layers may be substantially the same as in the first and second embodiments. The bulk semiconductor substrate 8' may include a sacrificial layer 9 as in the first and second embodiments at this step. Once the bulk semiconductor substrate 8' is provided, the same processing steps may be employed as in the first and second embodiments.

Since a buried insulator layer is not present in the bulk semiconductor substrate 8', the formation of the at least one deep trench 79 at a processing step corresponding to FIGS. 6A-6D is controlled so that the etch stops without etching into the top semiconductor layer 20. The bottom surface(s) of the at least one deep trench 79 include(s) only surface(s) of the bottom semiconductor layer 10. Thus, all exposed semiconductor surfaces of the at least one deep trench 79 are heavily doped. The at least one node dielectric 80 is formed directly on surfaces of the bottom semiconductor layer 10, and does not abut the top semiconductor layer 20. The same processing steps are subsequently employed as in the first and second embodiments.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    at least one semiconductor device located directly on a front side surface of a semiconductor substrate;
    a trench capacitor located directly on a backside surface of said semiconductor substrate and comprising a conductive inner electrode, a node dielectric, and a bottom semiconductor layer having a dopant concentration of $1.0 \times 10^{18}/cm^3$ or greater; and
    a pair of through-substrate vias electrically connecting said conductive inner electrode and said bottom semiconductor layer to said at least one semiconductor device.

2. The semiconductor structure of claim 1, further comprising a top semiconductor layer having a dopant concentration less than $1.0 \times 10^{18}/cm^3$ and located directly underneath said front side surface of said semiconductor substrate, wherein said at least one semiconductor device is located directly on said top semiconductor layer.

3. The semiconductor structure of claim 2, wherein an entirety of said top semiconductor layer is single crystalline and wherein an entirety of said bottom semiconductor layer is single crystalline.

4. The semiconductor structure of claim 2, further comprising:
    a front side dielectric layer located directly on said front side surface;
    a pair of metal interconnect structures embedded in said dielectric layer and abutting said at least one semiconductor device and said pair of through-substrate vias; and
    a pair of dielectric liners extending from said front side dielectric layer through said top semiconductor layer and said bottom semiconductor layer and to said backside surface and laterally abutting and surrounding said pair of through-substrate vias.

5. The semiconductor structure of claim 1, further comprising:
    at least one backside dielectric layer abutting said backside surface; and
    an array of substrate contact vias embedded in said at least one backside dielectric layer and vertically abutting said bottom semiconductor layer.

6. The semiconductor structure of claim 5, further comprising:
    a first conductive wiring structure abutting said array of substrate contact vias and electrically connected to one of said pair of through-substrate vias; and
    a second conductive wiring structure abutting said conductive inner electrode and electrically connected to the other of said pair of through-substrate vias.

7. The semiconductor structure of claim 1, wherein said node dielectric comprises silicon nitride, silicon oxide, silicon oxynitride, a dielectric metal oxide, a dielectric metal nitride, a dielectric metal oxynitride, a silicate alloy of a dielectric metal oxide, a silicate alloy of a dielectric metal nitride, a silicate alloy of a dielectric metal oxynitride, or an alloy or mixture thereof.

8. The semiconductor structure of claim 1, wherein said conductive inner electrode comprises a doped semiconductor material, a metal, a conductive metal nitride, or a combination thereof.

9. The semiconductor structure of claim 1, wherein said semiconductor substrate is a semiconductor-on-insulator (SOI) substrate including a buried insulator layer vertically abutting said top semiconductor layer and said bottom semiconductor layer.

10. The semiconductor structure of claim 9, wherein said node dielectric vertically abuts said buried insulator layer.

11. The semiconductor structure of claim 1, wherein said semiconductor substrate is a bulk substrate wherein said top semiconductor layer vertically abuts said bottom semiconductor layer.

12. The semiconductor structure of claim 1, wherein said at least one semiconductor device includes a field effect transistor.

13. A method of forming a semiconductor structure comprising:
    forming at least one semiconductor device directly on a front side surface of a semiconductor substrate;
    forming a pair of through-substrate vias extending at least from said front side surface of said semiconductor substrate to a backside surface of said semiconductor substrate; and
    forming a trench capacitor directly on said backside surface of said semiconductor substrate, wherein said trench capacitor comprises a conductive inner electrode, a node dielectric, and a bottom semiconductor layer having a dopant concentration of $1.0 \times 10^{18}/cm^3$ or greater, wherein said pair of through-substrate vias provide electrical connection between said at least one semiconductor device and conductive inner electrode and said bottom semiconductor layer.

14. The method of claim 13, wherein said semiconductor substrate includes a top semiconductor layer having a dopant concentration less than $1.0 \times 10^{18}/cm^3$ and located directly underneath said front side surface of said semiconductor substrate, and wherein said at least one semiconductor device is located directly on said top semiconductor layer.

15. The method of claim 14, further comprising:
    forming a front side dielectric layer directly on said front side surface;
    forming a pair of metal interconnect structures in said dielectric layer, wherein said pair of metal interconnect structures abut said at least one semiconductor device and said pair of through-substrate vias; and forming a pair of dielectric liners extending from said front side dielectric layer through said top semiconductor layer and said bottom semiconductor layer and to said backside surface, wherein said pair of dielectric liners laterally abuts and surrounds said pair of through-substrate vias.

16. The method of claim 13, further comprising:
forming at least one backside dielectric layer directly on backside surface; and
forming an array of substrate contact vias in said at least one backside dielectric layer and directly on said bottom semiconductor layer.

17. The method of claim 16, further comprising:
forming a first conductive wiring structure directly on said array of substrate contact vias, wherein said first conductive wiring structure is electrically connected to one of said pair of through-substrate vias; and forming a second conductive wiring structure directly on said conductive inner electrode, wherein said second conductive wiring structure is electrically connected the other of said pair of through-substrate vias.

18. The method of claim 13, wherein said semiconductor substrate is a semiconductor-on-insulator (SOI) substrate including a buried insulator layer vertically abutting said top semiconductor layer and said bottom semiconductor layer.

19. The method of claim 18, wherein said node dielectric vertically abuts said buried insulator layer.

20. The method of claim 13, wherein said semiconductor substrate is a bulk substrate wherein said top semiconductor layer vertically abuts said bottom semiconductor layer.

* * * * *